US009276404B2

(12) United States Patent
Kayama

(10) Patent No.: US 9,276,404 B2
(45) Date of Patent: Mar. 1, 2016

(54) SEMICONDUCTOR INTEGRATED CIRCUIT AND OPERATING METHOD THEREOF

(71) Applicant: Renesas Electronics Corporation, Kawasaki-shi, Kanagawa (JP)

(72) Inventor: Masanori Kayama, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 458 days.

(21) Appl. No.: 13/899,601

(22) Filed: May 22, 2013

(65) Prior Publication Data
US 2013/0313904 A1    Nov. 28, 2013

(30) Foreign Application Priority Data

May 28, 2012 (JP) ................................ 2012-120696

(51) Int. Cl.
| | |
|---|---|
| *H02J 3/00* | (2006.01) |
| *H02J 1/00* | (2006.01) |
| *H02J 7/00* | (2006.01) |
| *G06F 1/26* | (2006.01) |
| *H02J 9/06* | (2006.01) |

(52) U.S. Cl.
CPC ... *H02J 1/00* (2013.01); *G06F 1/26* (2013.01); *G06F 1/263* (2013.01); *G06F 1/266* (2013.01); *H02J 7/0055* (2013.01); *H02J 9/06* (2013.01); *Y10T 307/367* (2015.04)

(58) Field of Classification Search
CPC ............. H02J 1/00; H02J 7/0055; H02J 9/06; G06F 1/26; G06F 1/266; G06F 1/263; Y10T 307/367
See application file for complete search history.

(56) References Cited

U.S. PATENT DOCUMENTS

| | | |
|---|---|---|
| 2008/0315995 A1 | 12/2008 | Okuda |
| 2009/0322484 A1 | 12/2009 | Toriyama et al. |
| 2011/0156659 A1 | 6/2011 | Saeki et al. |

FOREIGN PATENT DOCUMENTS

| | | |
|---|---|---|
| JP | 2009-004949 A | 1/2009 |
| JP | 2010-009353 A | 1/2010 |
| JP | 2011-155830 A | 8/2011 |

*Primary Examiner* — Daniel Cavallari
(74) *Attorney, Agent, or Firm* — Shapiro, Gabor and Rosenberger, PLLC

(57) ABSTRACT

A semiconductor integrated circuit and its operating method are provided. The present circuit has first and second supply terminals capable of supplying first and second power supply voltages respectively, an input voltage selection circuit coupled to the first and second supply terminals, and first and second power supply switches. The input voltage selection circuit includes a power-on reset circuit, an input voltage detection circuit and a control circuit. When the supply of the first or second power supply voltage to one of both supply terminals is detected upon completion of a power on reset operation, one of both power supply switches and the other thereof are controlled to on and off respectively. When the supply of both power supply voltages to both supply terminals is detected, the one thereof and the other thereof are respectively controlled to on and off according to the preset order of precedence.

20 Claims, 8 Drawing Sheets

FIG. 3

| TERMINAL NAME | TERMINAL FUNCTION | TERMINAL NAME | TERMINAL FUNCTION |
|---|---|---|---|
| INPUT VOLTAGE 1 | POWER SUPPLY SOURCE INPUT TERMINAL BASED ON WIRELESS POWER TRANSMISSION OR AC POWER INTERFACE | DDOUT1 | DCDC CONVERTER OUTPUT (SWITCHING OUTPUT) |
| INPUT VOLTAGE 2 | POWER SUPPLY SOURCE INPUT TERMINAL BASED ON USB POWER SUPPLY | DDOUT2 | DCDC CONVERTER OUTPUT (AFTER PASSAGE OF LOW-PASS FILTER) |
| D+ | SUPPLY OF NON-INVERSION INPUT SIGNAL OF USB DIFFERENTIAL DATA | SYS | POWER OUTPUT TO POWER RECEIVING SIDE SYSTEM 3 |
| D− | SUPPLY OF INVERSION INPUT SIGNAL OF USB DIFFERENTIAL DATA | BAT | COUPLING TERMINAL OF SECONDARY BATTERY 26 |
| CLOCK | CLOCK TERMINAL OF EXTERNAL INTERFACE | VDD18 | 1.8 V POWER OUTPUT (SUPPLY TO MCU) |
| SERIAL DATA | SERIAL INPUT/OUTPUT TERMINAL OF EXTERNAL INTERFACE | VDD30 | 3.0 V POWER OUTPUT (SUPPLY TO MCU) |

SEMICONDUCTOR INTEGRATED CIRCUIT AND OPERATING METHOD THEREOF

CROSS-REFERENCE TO RELATED APPLICATIONS

The disclosure of Japanese Patent Application No. 2012-120696 filed on May 28, 2012 including the specification, drawings and abstract is incorporated herein by reference in its entirety.

BACKGROUND

The present invention relates to a semiconductor integrated circuit and an operating method thereof and particularly to a technology effective in implementing an electronic circuit for automatically selecting a power supply to be used out of a plurality of power supplies.

As has been described in, for example, each of the following Patent Documents 1 and 2, an IC card is equipped with a semiconductor integrated circuit and an antennal coil, and the supply of power to the IC card is performed by receiving an RF signal outputted from a reading/writing device called a card reader/card writer by the antenna coil and rectifying the same by a rectifier circuit. Thus, the IC card having no power supply on its card side is becoming pervasive in an automatic ticket system, e-cash, logistics management, etc. Thus, since the IC card is RF-power supplied and on the other hand, unique identification information (ID information) has been stored in a built-in non-volatile memory, it is called an RFID card.

On the other hand, a wireless power delivery system has been in widespread use which is called "just-to-place charging" in which a portable device such as a smart phone is simply placed in a dedicated charging table without coupling the portable device to a power supply cable to thereby enable the charging of the portable device. This type of wireless power delivery system intends to cope with the fact that the battery drain of the cellular phone called "smart phone" is large. That is, the smart phone is a multifunction cellular phone having a high affinity to Internet and based on the functions of a personal computer, or a multifunction cellular phone with a PDA function added to a phone/mail, which may be abbreviated as "smapho" or "smaho". The wireless power delivery system is based on the international standard called Qi (chi) established by Wireless Power Consortium (WPC) of the industry group. Both of a transmission side device and a reception side device are respectively provided with coils to thereby enable the supply of power from the transmission side device to the reception side device by an electromagnetic induction system. The advantages of the wireless power delivery system are that there is no need to plug or unplug a power connector for charging and the operation of opening and closing a connector cover for a power connector of a portable device in particular can be omitted.

Further, it has been described in the following Patent Document 3 that in an electronic device selectively coupled to two or more types of power supplies to charge a battery, a controller is used to couple the electronic device to another power supply soon when the coupling to the power supply subjected to the supply of power is released, to thereby start the charging of the battery. That is, the control provided by the controller resides in that the battery is charged by an AC power supply while current is being supplied from the AC power supply to an AC coupling part, whereas while current is being supplied from an external device to an external device coupling part without the supply of current from the AC power supply to the AC coupling part, the battery is charged by the power supply of the external device. When the external device coupling part is coupled to the external device while the battery is being charged by the AC power supply, the controller particularly performs an initial communication with the external device to thereby conduct charge settings necessary to charge the battery through the external device. Specifically, the external device coupling part is a USB coupling part, and an interface of another standard such as IEEE1394 or the like can also be adopted. Since the current from the AC power supply is larger than that from the external device when the electronic device is coupled to both of the AC power supply and the external device, the controller serves to charge the battery through the AC power supply.

RELATED ART DOCUMENTS

Patent Document

[Patent Document 1] Japanese Unexamined Patent Publication Laid-Open No. 2009-4949
[Patent Document 2] Japanese Unexamined Patent Publication Laid-Open No. 2010-9353
[Patent Document 3] Japanese Unexamined Patent Publication Laid-Open No. 2011-155830

SUMMARY

Prior to the present invention, the present inventors have been involved in the development of a semiconductor integrated circuit for battery charging control, which is capable of operation by a plurality of power supply voltages of an AC-DC power supply voltage generated by rectification/smoothing of an AC power supply voltage from an AC power supply, a USB power supply voltage from USB coupling, and a power supply voltage based on a wireless power delivery of the above wireless power delivery system.

In the process of its development, the present inventors have discussed the method of charging the battery by the power supplies described in the Patent Document 3. According to the discussion made by the present inventors, however, there has been revealed a problem that an implementation method for automatically selecting a used power supply in accordance with the presence or absence of the supply of a plurality of power supplies has not been described in the Patent Document 3. That is, the semiconductor integrated circuit for the battery charging control, which is capable of operation by the power supply voltages described above, needs to implement an electronic circuit that automatically selects a power supply to be used from a plurality of power supplies.

While means and the like for solving such a problem are described below, other objects and novel features of the present invention will become apparent from the description of the present specification and the accompanying drawings.

A summary of a representative embodiment disclosed in the present application will be explained in brief as follows:

A semiconductor integrated circuit (212) according to a typical embodiment is equipped with a first supply terminal (T1) capable of supplying a first power supply voltage, a second supply terminal (T2) capable of supplying a second power supply voltage, an input voltage selection circuit (2124), a first power supply switch (SW1, SW2) and a second power supply switch (SW3) (refer to FIG. 2).

The input voltage selection circuit (2124) includes a power-on reset circuit (21244), an input voltage detection circuit (21248) and a control circuit (21245, 21246) (refer to FIG. 4).

When the supply of the first or second power supply voltage to either the first or second supply terminal is detected by the input voltage detection circuit at the end of a power on reset operation of the power-on reset circuit, one of the first and second power supply switches and the other thereof are respectively controlled to an on state and an off state by the control circuit that has responded to its detection.

When the supply of both of the first and second power supply voltages to both of the first and second supply terminals is detected by the input voltage detection circuit at the end of the power on reset operation of the power-on reset circuit, one of the first and second power supply switches and the other thereof are respectively controlled to an on state and an off state by the control circuit in accordance with the order of precedence set in advance.

An advantageous effect obtained by a typical one of embodiments disclosed in the present application will be explained in brief as follows:

According to the present semiconductor integrated circuit (212), an electronic circuit for automatically selecting a power supply to be used out of a plurality of power supplies can be implemented.

BRIEF DESCRIPTION OF THE DRAWINGS

FIG. 3 is a diagram depicting functions of external terminals of the semiconductor integrated circuit 212 for the battery charging control, according to the first embodiment shown in FIG. 2;

DETAILED DESCRIPTION

1. Summary of the Embodiments

Figure 1:
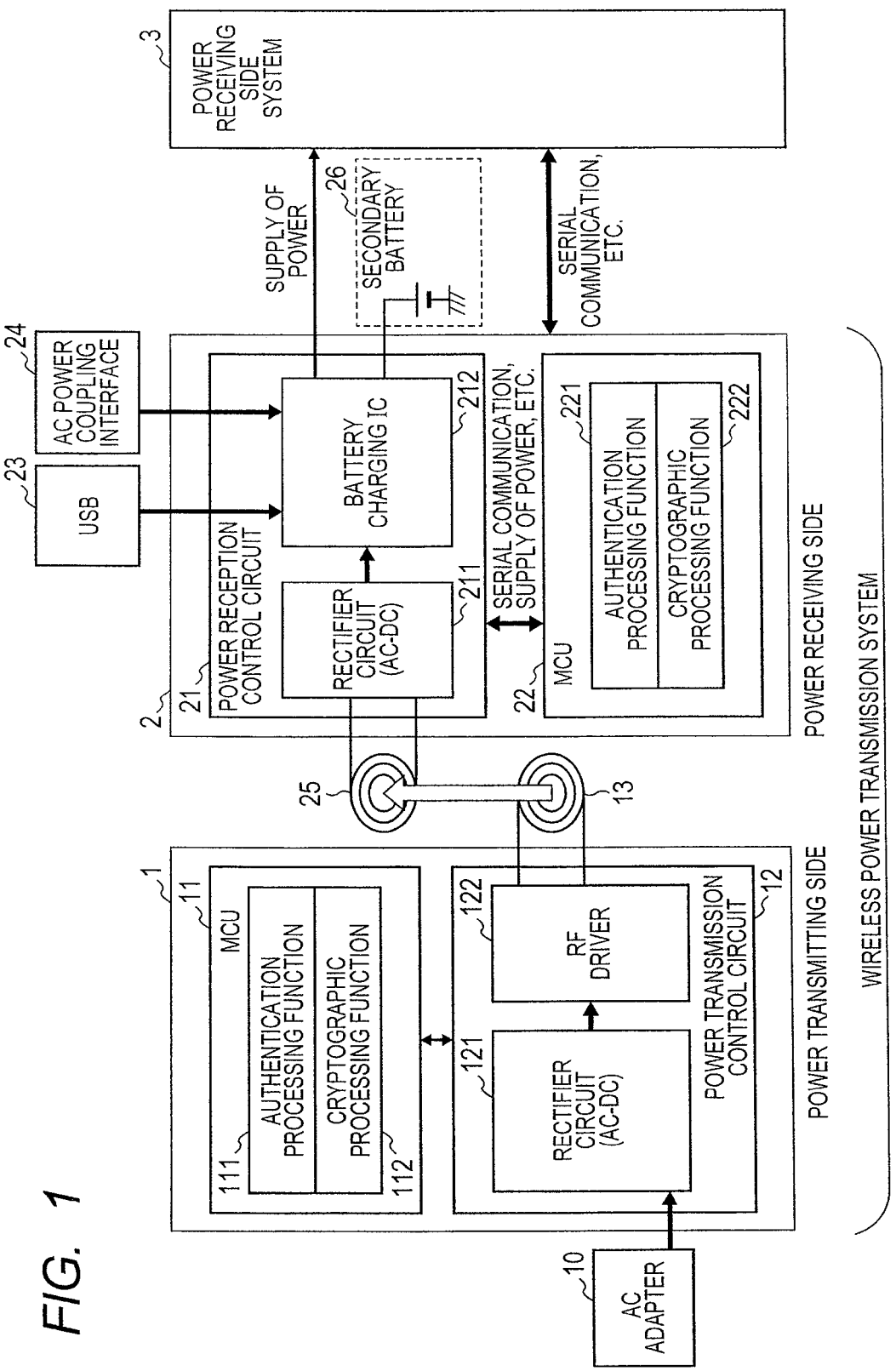
FIG. 1 is a diagram showing a configuration of a multifunction cellular phone equipped with a semiconductor integrated circuit 212 for battery charging control, according to a first embodiment.

A summary of typical embodiments of the invention disclosed in the present application will first be explained. Reference numerals of the accompanying drawings referred to with parentheses in the description of the summary of the typical embodiments only illustrate elements included in the concept of components to which the reference numerals are given.

Figure 2:
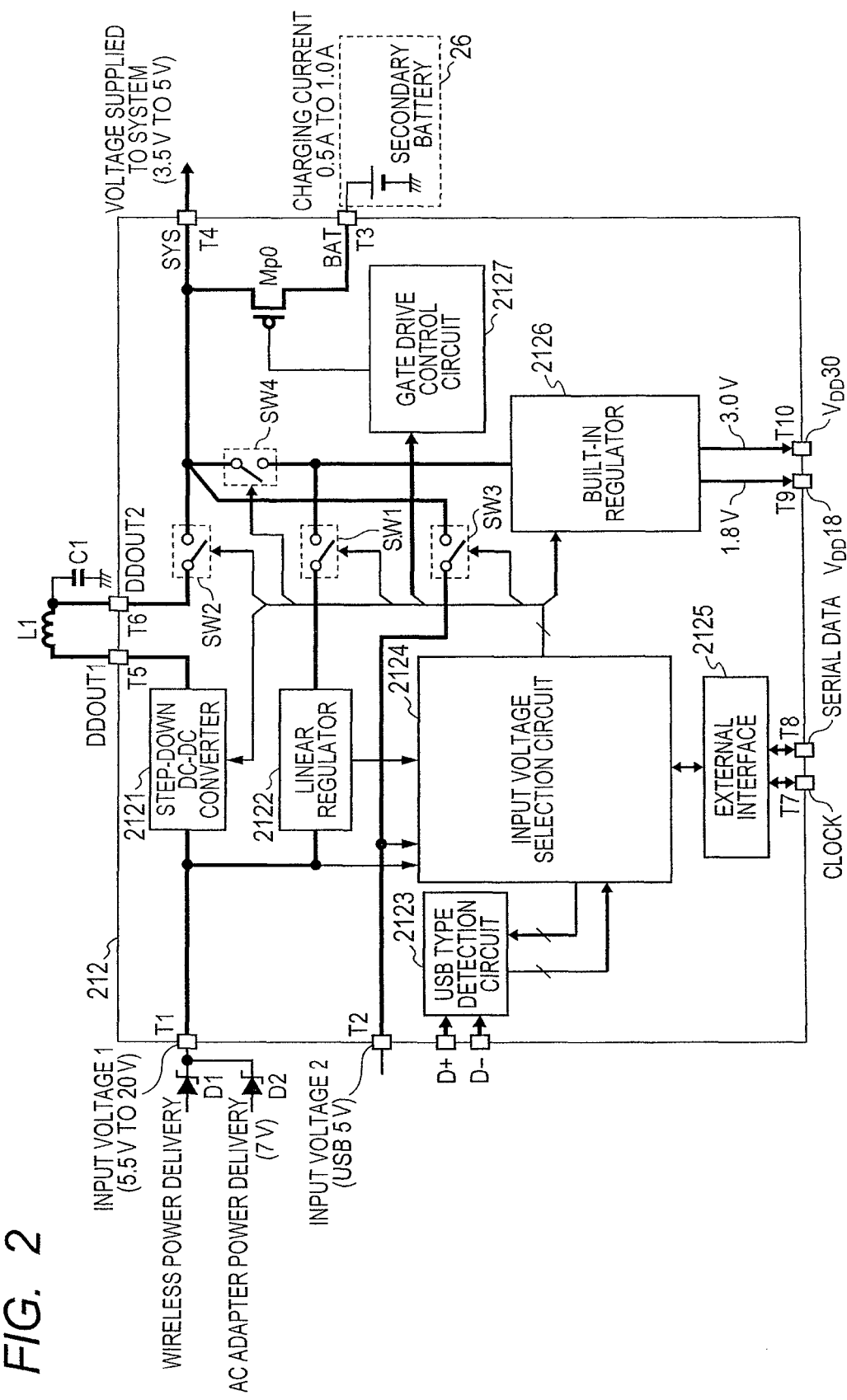
FIG. 2 is a diagram illustrating a configuration of the semiconductor integrated circuit 212 for the battery charging control, according to the first embodiment shown in FIG. 1.

[1] A semiconductor integrated circuit (212) according to a typical embodiment is equipped with a first supply terminal (T1) capable of supplying a first power supply voltage, a second supply terminal (T2) capable of supplying a second power supply voltage, an input voltage selection circuit (2124) coupled to the first supply terminal and the second supply terminal, a first power supply switch (SW1, SW2) and a second power supply switch (SW3) (refer to FIG. 2).

Figure 4:
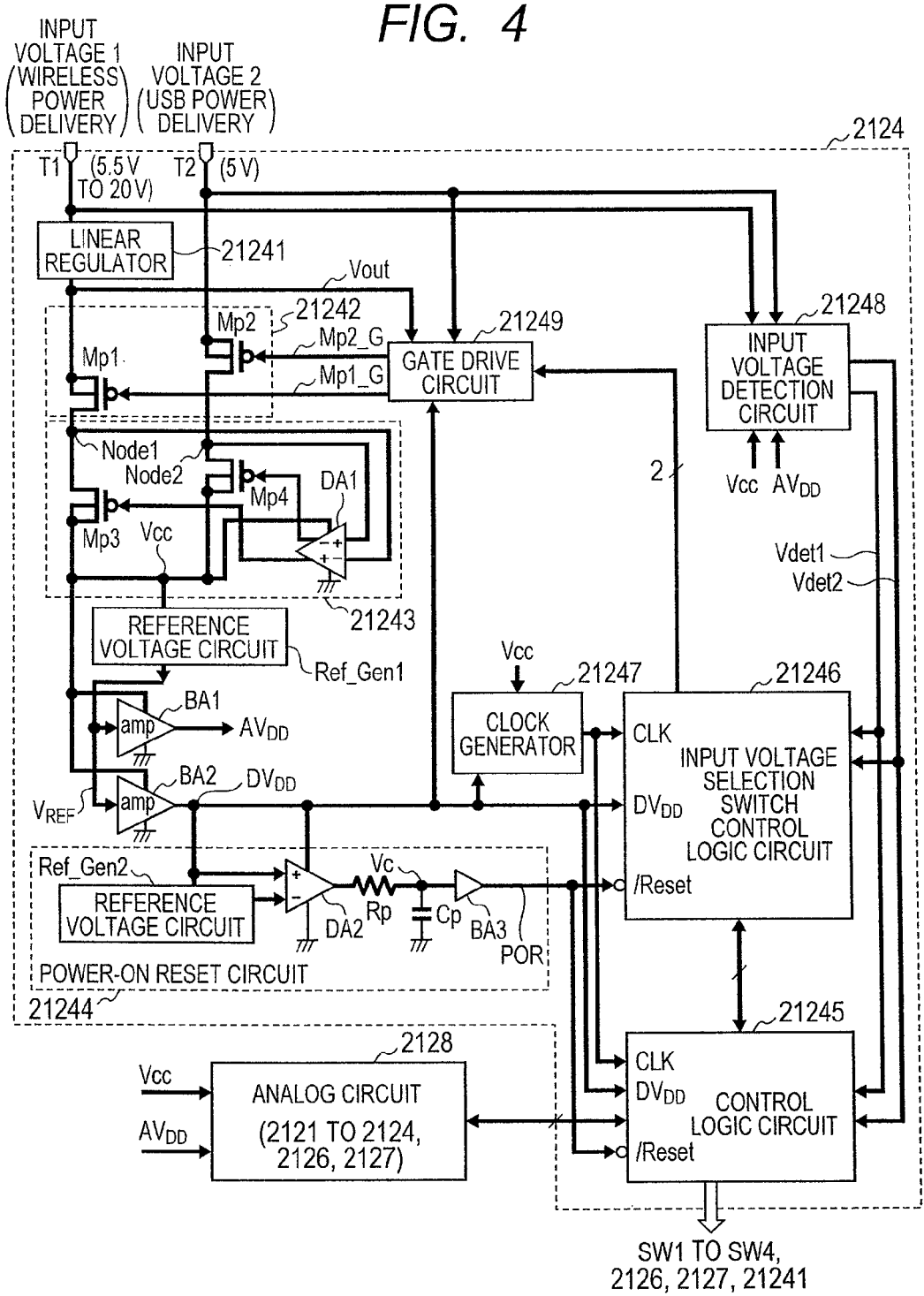
FIG. 4 is a diagram showing a configuration of an input voltage detection circuit 2124 for the selection of an operation mode at start-up of the semiconductor integrated circuit 212 according to the first embodiment shown in FIG. 2.

The input voltage selection circuit (2124) includes a power-on reset circuit (21244), an input voltage detection circuit (21248) and a control circuit (21245, 21246) (refer to FIG. 4).

In response to the supply of the first power supply voltage to the first supply terminal (T1) and the supply of the second power supply voltage to the second supply terminal (T2), the power-on reset circuit (21244) generates a power on reset signal (POR).

The input voltage detection circuit (21248) generates a first voltage detection output signal (Vdet1) in response to the supply of the first power supply voltage to the first supply terminal (T1). The input voltage detection circuit (21248) generates a second voltage detection output signal (Vdet2) in response to the supply of the second power supply voltage to the second supply terminal (T2).

The control circuit (21245, 21246) controls the first power supply switch and the second power supply switch in response to the power on reset signal (POR), the first voltage detection output signal (Vdet1) and the second voltage detection output signal (Vdet2).

The input voltage detection circuit (21248) detects the supply of the first power supply voltage to the first supply terminal (T1) and the supply of the second power supply voltage to the second supply terminal (T2) at a timing of a change in the level of the power on reset signal (POR) responsive to the end of a power on reset operation of the power-on reset circuit (21244).

Figure 5:
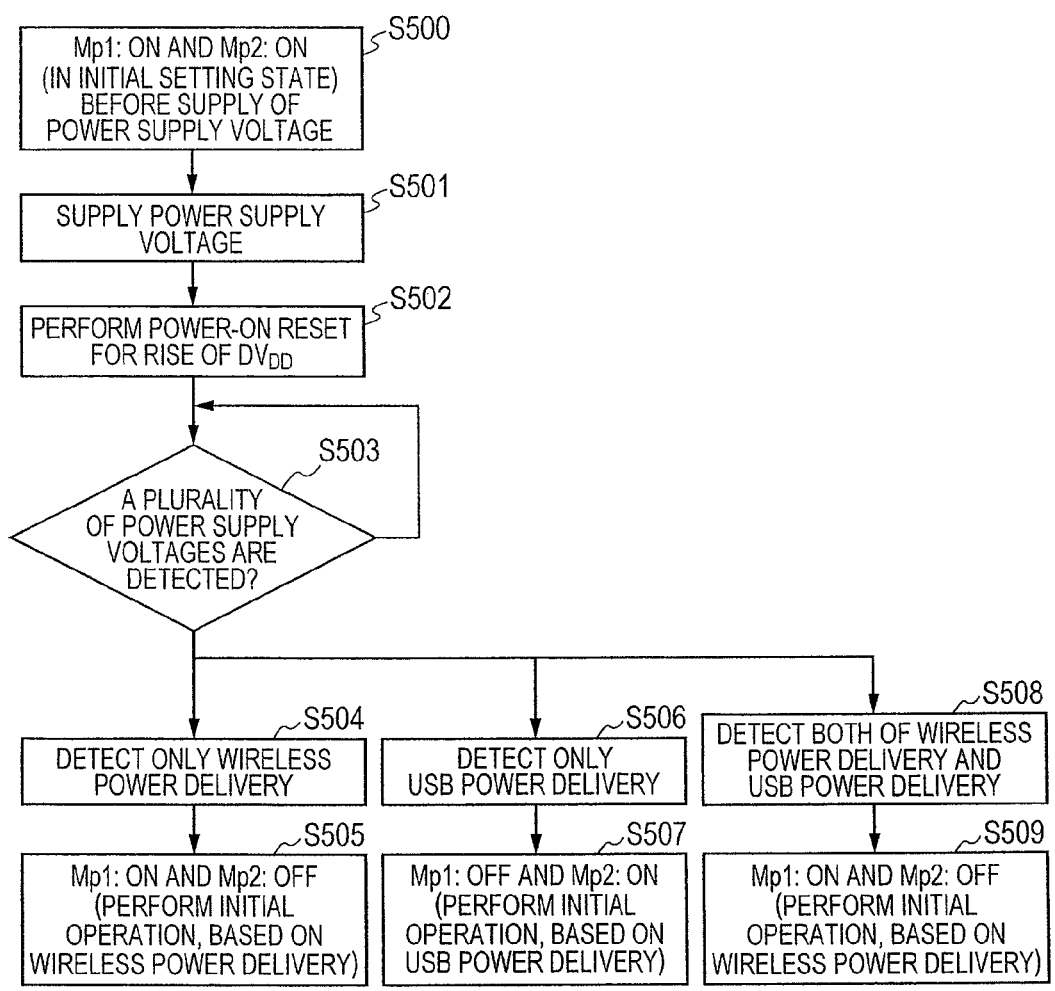
FIG. 5 is a diagram illustrating the operation of automatically selecting a power supply to be used out of a plurality of power supplies by the semiconductor integrated circuit 212 according to the first embodiment shown in FIGS. 2 and 4.

In a first case where at the timing of the change in the level of the power on reset signal, the input voltage detection circuit detects the supply of the first power supply voltage to the first supply terminal but does not detect the supply of the second power supply voltage to the second supply terminal, the control circuit controls the first power supply switch and the second power supply switch to an on state and an off state respectively after the end of the power on reset operation (FIG. 5: S504 and S505).

The first power supply switch and the second power supply switch are respectively controlled to the on state and the off state respectively after the end of the power on reset operation, whereby the first power supply switch controlled to the on state supplies the first power supply voltage supplied to the first supply terminal to a load (3, 26) (FIG. 5: S505).

In a second case where at the timing of the change in the level of the power on reset signal, the input voltage detection circuit detects the supply of the second power supply voltage to the second supply terminal but does not detect the supply of the first power supply voltage to the first supply terminal, the control circuit controls the first power supply switch and the second power supply switch to an off state and an on state respectively after the end of the power on reset operation (FIG. 5: S506 and S507).

The first power supply switch and the second power supply switch are respectively controlled to the off state and the on state respectively after the end of the power on reset operation, whereby the second power supply switch controlled to the on state supplies the second power supply voltage supplied to the second supply terminal to the load (3, 26) (FIG. 5: S507).

In a third case where at the timing of the change in the level of the power on reset signal, the input voltage detection circuit detects the supply of the first power supply voltage to the first supply terminal and the supply of the second power supply voltage to the second supply terminal, the control circuit controls one of the first power supply switch and the second power supply switch and the other thereof to an on state and an off state respectively after the end of the power on reset operation (FIG. 5: S508 and S509).

In the third case, the one of the first power supply switch and the second power supply switch and the other thereof are respectively controlled to the on state and the off state in accordance with the order of precedence set to the control circuit in advance.

The one thereof controlled to the on state supplies the first power supply voltage or the second power supply voltage supplied to the first supply terminal or the second supply terminal to the load (3, 26) (FIG. 5: S505).

According to the embodiment, an electronic circuit for automatically selecting a power supply to be used out of a plurality of power supplies can be implemented.

A semiconductor integrated circuit (212) according to a preferred embodiment further includes a first external output terminal (T4) and a second external output terminal (T3) which supply the first power supply voltage or the second power supply voltage to a first external load (3) and a second external load (26) each taken as the load.

The semiconductor integrated circuit (212) furthermore includes an output P channel MOS transistor (Mp0) coupled between the first external output terminal and the second external output terminal.

When either of the first power supply switch and the second power supply switch is controlled to an on state after the end of the power on reset operation, the output P channel MOS transistor (Mp0) is controlled to an on state by the control circuit (21245, 21246).

The control of the output P channel MOS transistor to the on state enables the first power supply voltage or the second power supply voltage to be supplied to the second external load through the output P channel MOS transistor and the second external output terminal (T3) (refer to FIGS. 2 and 4).

In another preferred embodiment, the first external output terminal (T4) is configured so as to be capable of supplying the first power supply voltage or the second power supply voltage to the first external load (3) corresponding to another semiconductor integrated circuit taken as an active device.

The output P channel MOS transistor and the second external output terminal are configured so as to be capable of supplying the first power supply voltage or the second power supply voltage to the second external load (26) taken as a battery (refer to FIG. 2).

In a further preferred embodiment, the input voltage selection circuit (2124) further includes an input voltage selection switch (21242) and a gate drive circuit (21249).

The input voltage selection switch includes a first input P channel MOS transistor (Mp1) and a second input P channel MOS transistor (Mp2). A source of the first input P channel MOS transistor is coupled to the first supply terminal. A source of the second input P channel MOS transistor is coupled to the second supply terminal.

During a power on reset period of the power-on reset circuit (21244), the gate drive circuit (21249) controls both of the first and second input P channel MOS transistors of the input voltage selection switch to an on state.

During the power on reset period, an operating voltage (Vcc) to be supplied to the power-on reset circuit is generated from a drain of the first input P channel MOS transistor or a drain of the second input P channel MOS transistor (refer to FIG. 4).

In yet another preferred embodimemt, in the first case, the gate drive circuit controls the first and second input P channel MOS transistors of the input voltage selection switch to an on state and an off state respectively.

In the second case, the gate drive circuit controls the first and second input P channel MOS transistors of the input voltage selection switch to an on state and an off state respectively.

In the third case, the gate drive circuit controls one of the first and second input P channel MOS transistors of the input voltage selection switch and the other thereof to an on state and an off state respectively in accordance with the order of precedence set to the control circuit in advance (refer to FIG. 4).

In a still further preferred embodiment, the input voltage selection circuit (2124) further includes a voltage comparison/selection circuit (21243) having a first input terminal (Node1), a second input terminal (Nodet2) and an output terminal.

The first input terminal (Node1) of the voltage comparison/selection circuit is coupled to the drain of the first input P channel MOS transistor of the input voltage selection switch.

The second input terminal (Node2) of the voltage comparison/selection circuit is coupled to the drain of the second input P channel MOS transistor of the input voltage selection switch.

The operating voltage supplied to the power-on reset circuit is generated from the output terminal of the voltage comparison/selection circuit.

The voltage comparison/selection circuit compares a voltage of the first input terminal and a voltage of the second input terminal to select a high voltage and thereby outputs the high voltage as the operating voltage supplied from the output terminal to the power-on reset circuit (refer to FIG. 4).

Figure 6:
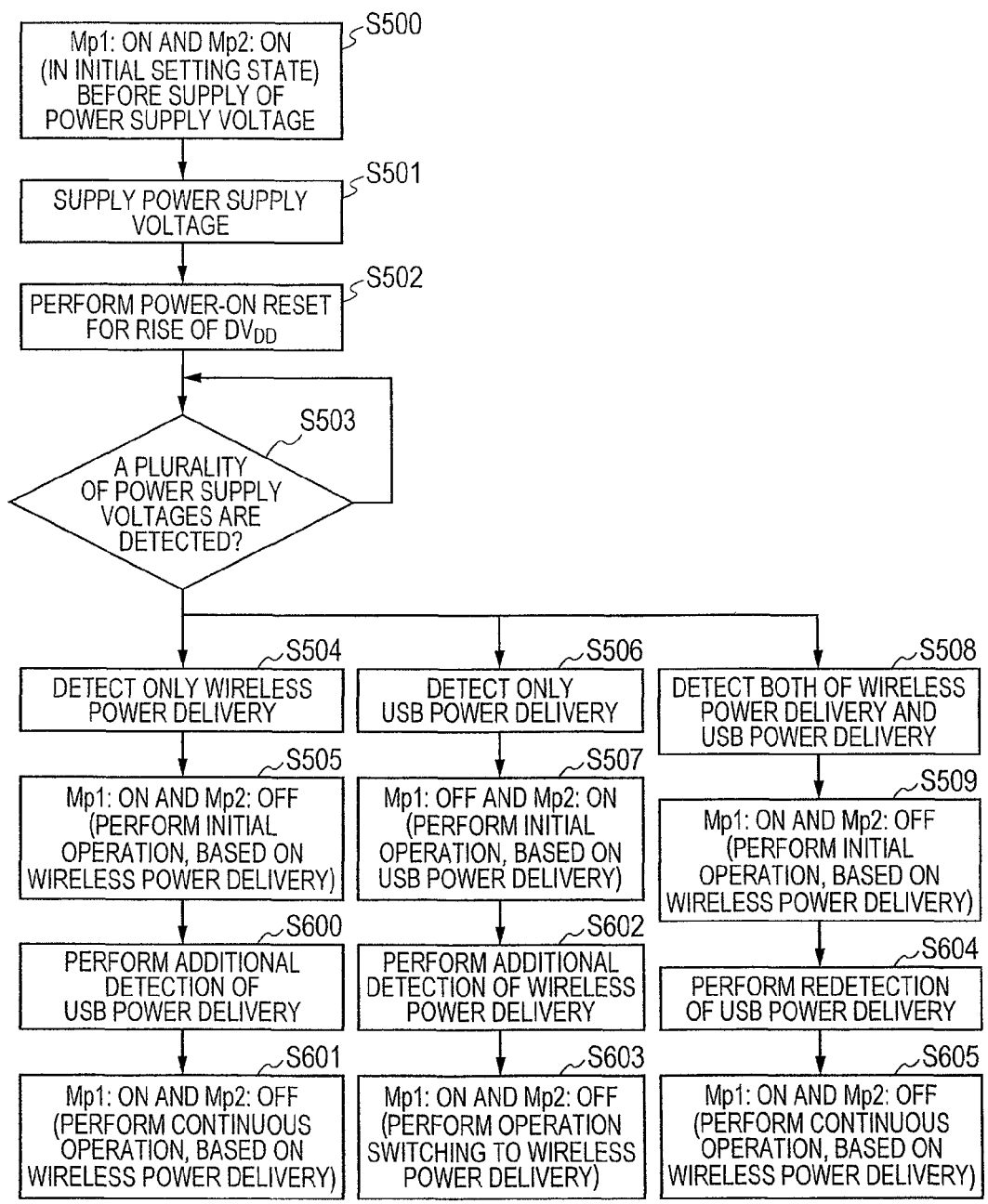
FIG. 6 is a diagram depicting the operation of automatically selecting a power supply to be used out of a plurality of power supplies by the semiconductor integrated circuit 212 according to a second embodiment shown in FIGS. 2 and 4.

In a still further embodiment, with the occurrence of the first case, a fourth case in which the input voltage detection circuit (2124) detects the supply of the second power supply voltage to the second supply terminal occurs after the first and second power supply switches are respectively controlled to the on state and the off state (FIG. 6: S505) after the end of the power on reset operation (FIG. 6: S600).

In response to the occurrence of the fourth case, the control circuit controls the one of the first power supply switch and the second power supply switch and the other thereof to the on state and the off state respectively in accordance with the order of precedence set to the control circuit in advance, as with the third case.

With the occurrence of the second case, a fifth case in which the input voltage detection circuit (2124) detects the supply of the first power supply voltage to the first supply terminal occurs after the first and second power supply switches are respectively controlled to the off state and the on state (FIG. 6: S507) after the end of the power on reset operation (FIG. 6: S602).

In response to the occurrence of the fifth case, the control circuit controls the one of the first power supply switch and the second power supply switch and the other thereof to the on state and the off state respectively in accordance with the order of precedence set to the control circuit in advance, as with the third case (FIG. 6: S603).

With the occurrence of the third case, a sixth case in which the input voltage detection circuit (2124) detects the supply of the second power supply voltage to the second supply terminal occurs after the one of the first and second power supply switches and the other thereof are respectively controlled to the on state and the off state (FIG. 6: S509) after the end of the power on reset operation (FIG. 6: S604).

In response to the occurrence of the sixth case, the control circuit controls the one of the first power supply switch and the second power supply switch and the other thereof to the on state and the off state respectively in accordance with the order of precedence set to the control circuit in advance, as with the third case (FIG. 6: S605).

Figure 8:
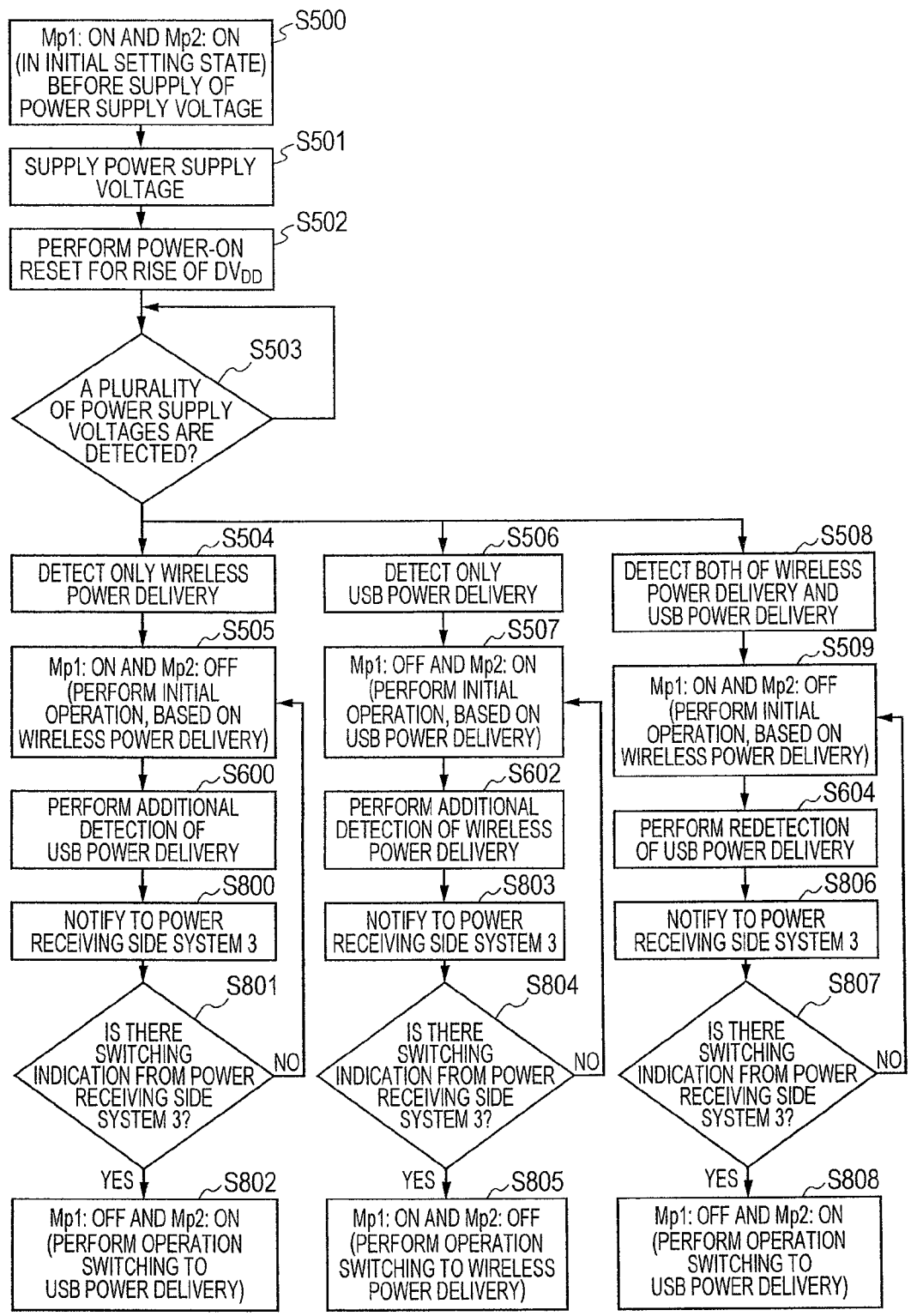
FIG. 8 is a diagram illustrating the operation of automatically selecting a power supply to be used out of a plurality of power supplies by the semiconductor integrated circuit 212 according to a third embodiment shown in FIGS. 2 and 4.

In a still further preferred embodiment, with the occurrence of the first case, a fourth case in which the input voltage detection circuit (2124) detects the supply of the second power supply voltage to the second supply terminal occurs after the first and second power supply switches are respectively controlled to the on state and the off state (FIG. 8: S505) after the end of the power on reset operation (FIG. 8: S600).

In response to the occurrence of the fourth case, the semiconductor integrated circuit is capable of notifying the occurrence of the fourth case to another semiconductor integrated circuit described above taken as the first external load (FIG. 8: S800).

In response to a first notice indicative of the occurrence of the fourth case, the control circuit controls the first power supply switch and the second power supply switch in accordance with a first indication supplied from another semiconductor integrated circuit described above to the semiconductor integrated circuit (FIG. 8: S801-S802).

In accordance with the first indication, the control circuit controls the first power supply switch and the second power supply switch to an on state and an off state respectively (FIG. 8: S505) or controls the first power supply switch and the second power supply switch to an off state and an on state respectively (FIG. 8: S802).

With the occurrence of the second case, a fifth case in which the input voltage detection circuit (2124) detects the supply of the first power supply voltage to the first supply terminal occurs after the first and second power supply switches are respectively controlled to the off state and the on state (FIG. 8: S507) after the end of the power on reset operation (FIG. 8: S602).

In response to the occurrence of the fifth case, the semiconductor integrated circuit is capable of notifying the occurrence of the fifth case to another semiconductor integrated circuit described above taken as the first external load (FIG. 8: S803).

In response to a second notice indicative of the occurrence of the fifth case, the control circuit controls the first power supply switch and the second power supply switch in accordance with a second indication supplied from another semiconductor integrated circuit described above to the semiconductor integrated circuit (FIG. 8: S804-S805).

In accordance with the second indication, the control circuit controls the first power supply switch and the second power supply switch to an off state and an on state respectively (FIG. 8: S507) or controls the first power supply switch and the second power supply switch to an on state and an off state respectively (FIG. 8: S805).

With the occurrence of the third case, a sixth case in which the input voltage detection circuit (2124) detects the supply of the second power supply voltage to the second supply terminal occurs after the one of the first and second power supply switches and the other thereof are respectively controlled to the on state and the off state (FIG. 8: S509) after the end of the power on reset operation (FIG. 8: S604).

In response to the occurrence of the sixth case, the semiconductor integrated circuit is capable of notifying the occurrence of the sixth case to another semiconductor integrated circuit described above taken as the first external load (FIG. 8: S806).

In response to a third notice indicative of the occurrence of the sixth case, the control circuit controls the first power supply switch and the second power supply switch in accordance with a third indication supplied from another semiconductor integrated circuit described above to the semiconductor integrated circuit (FIG. 8: S807-S808).

In accordance with the third indication, the control circuit controls the first power supply switch and the second power supply switch to an on state and an off state respectively (FIG. 8: S509) or controls the first power supply switch and the second power supply switch to an off state and an on state respectively (FIG. 8: S808).

A semiconductor integrated circuit (212) according to a specific embodiment further includes a step-down DC-DC converter (2121) and a linear regulator (2122) coupled in parallel between the first supply terminal (T1) and the first power supply switch (SW1, SW2).

The linear regulator operates as a series regulator which quickly operates immediately after power-on based on the supply of the first power supply voltage to the first supply terminal.

The step-down DC-DC converter (2121) operates as a switching regulator having power efficiency higher than the linear regulator (refer to FIG. 2).

As the most specific embodiment, there is provided one in which the first supply terminal (T1) is configured so as to be capable of supplying a power supply voltage based on a wireless power delivery to the first supply terminal (T1) through a first Schottky diode (D1) and an AC-DC conversion power supply voltage from an AC power supply coupling interface (24) thereto through a second Schottky diode (D2).

The second supply terminal (T2) is configured so as to be capable of supplying a USB power supply voltage from a USB coupling interface (23) to the second supply terminal (T2) (refer to FIG. 2).

[2] A typical embodiment according to another aspect is an operating method of a semiconductor integrated circuit (212) equipped with a first supply terminal (T1) capable of supplying a first power supply voltage, a second supply terminal (T2) capable of supplying a second power supply voltage, an input voltage selection circuit (2124) coupled to the first supply terminal and the second supply terminal, a first power supply switch (SW1, SW2), and a second power supply switch (SW3) (refer to FIG. 2).

The input voltage selection circuit (2124) includes a power-on reset circuit (21244), an input voltage detection circuit (21248) and a control circuit (21245, 21246).

The power-on reset circuit (21244) generates a power on reset signal (POR) in response to the supply of the first power supply voltage to the first supply terminal (T1) and the supply of the second power supply voltage to the second supply terminal (T2).

The input voltage detection circuit (21248) generates a first voltage detection output signal (Vdet1) in response to the supply of the first power supply voltage to the first supply terminal (T1) and generates a second voltage detection output signal (Vdet2) in response to the supply of the second power supply voltage to the second supply terminal (T2).

The control circuit (21245, 21246) controls the first power supply switch and the second power supply switch in response to the power on reset signal (POR), the first voltage detection output signal (Vdet1) and the second voltage detection output signal (Vdet2).

The input voltage detection circuit (21248) detects the supply of the first power supply voltage to the first supply terminal (T1) and the supply of the second power supply voltage to the second supply terminal (T2) at a timing of a change in the level of the power on reset signal (POR) responsive to the end of a power on reset operation of the power-on reset circuit (21244).

In a first case where at the timing of the change in the level of the power on reset signal (POR), the input voltage detection circuit detects the supply of the first power supply voltage to the first supply terminal but does not detect the supply of the second power supply voltage to the second supply terminal, the control circuit controls the first power supply switch and the second power supply switch to an on state and an off state respectively after the end of the power on reset operation (FIG. 5: S504 and S505).

The first power supply switch and the second power supply switch are respectively controlled to the on state and the off state after the end of the power on reset operation, so that the first power supply switch controlled to the on state supplies the first power supply voltage supplied to the first supply terminal to a load (3, 26) (FIG. 5: S505).

In a second case where at the timing of the change in the level of the power on reset signal, the input voltage detection circuit detects the supply of the second power supply voltage to the second supply terminal but does not detect the supply of the first power supply voltage to the first supply terminal, the control circuit controls the first power supply switch and the second power supply switch to an off state and an on state respectively after the end of the power on reset operation (FIG. 5: S506 and S507).

The first power supply switch and the second power supply switch are respectively controlled to the off state and the on state after the end of the power on reset operation, so that the second power supply switch controlled to the on state supplies the second power supply voltage supplied to the second supply terminal to the load (3, 26) (FIG. 5: S507).

In a third case where at the timing of the change in the level of the power on reset signal, the input voltage detection circuit detects the supply of the first power supply voltage to the first supply terminal and the supply of the second power supply voltage to the second supply terminal, the control circuit controls one of the first power supply switch and the second power supply switch and the other thereof to an on state and an off state respectively after the end of the power on reset operation (FIG. 5: S508 and S509).

In the third case, the one of the first power supply switch and the second power supply switch and the other thereof are respectively controlled to the on state and the off state in accordance with the order of precedence set to the control circuit in advance.

The one thereof controlled to the on state supplies the first power supply voltage or the second power supply voltage supplied to the first supply terminal or the second supply terminal to the load (3, 26) (FIG. 5: S505).

According to the embodiment, an electronic circuit for automatically selecting a power supply to be used out of a plurality of power supplies can be implemented.

2. Further Detailed Description of the Embodiments

Embodiments will next be explained in further detail. Incidentally, in all of the drawings for explaining the best modes for carrying out the invention, the same reference numerals are respectively attached to components having the same function as in the drawings, and their repetitive description will be omitted.

[First Embodiment]
<<Configuration of Multifunction Cellular Phone>>

FIG. 1 is a diagram showing a configuration of a multifunction cellular phone equipped with a semiconductor integrated circuit 212 for battery charging control, according to a first embodiment.

The multifunction cellular phone shown in FIG. 1 is comprised of a power transmitting circuit 1, a power receiving circuit 2 and a power receiving side system 3. In the multifunction cellular phone shown in FIG. 1 in particular, an RF signal from a power transmitting side antenna coil 13 is received by a power receiving side antenna coil 25 so that the charging of a secondary battery 26 and the supply of power to the power receiving side system 3 are performed.

<<Power Transmitting Circuit on the Transmission Side>>

As shown in FIG. 1, the power transmitting circuit 1 on the transmission side of a wireless power transmission system is supplied with an AC power supply through an AC adaptor 10. The power transmitting circuit 1 is comprised of a microcontroller unit (MCU) 11 and a power transmission control circuit 12. The microcontroller unit (MCU) 11 has an authentication processing function 111 and a cryptographic processing function 112. The power transmission control circuit 12 includes a rectifier circuit 121 and an RF driver 122. The RF driver 122 is coupled to the power transmitting side antenna coil 13.

A DC power supply voltage generated by rectifying and smoothing the AC power supply supplied via the AC adaptor 10 by the rectifier circuit 121 is supplied to the microcontroller unit (MCU) 11, the RF driver 122 and the like in the power transmitting circuit 1. The authentication processing function 111 and the cryptographic processing function 112 of the microcontroller unit (MCU) 11 in the power transmitting circuit 1 respectively perform a mutual authentication process for determining whether a user having the multifunction cellular phone corresponding to the power receiving circuit 2 is a user having a legitimate use right, and etc., and a cryptographic process for preventing interpolation of communication data. That is, the microcontroller unit (MCU) 11 of the power transmitting circuit 1 performs a key management operation related to the generation, retention, renewal, deletion and the like of a cipher key related to a communication protocol between an authentication processing function 221 and a cryptographic processing function 222 of a microcontroller unit (MCU) 22 included in the power receiving circuit 2.

As a result, when it is determined by the microcontroller unit (MCU) 11 of the power transmitting circuit 1 that the user of the multifunction cellular phone corresponding to the power receiving circuit 2 is of the user having the legitimate use right, the RF driver 122 generates an RF drive signal to be supplied to the power transmitting side antenna coil 13 in response to an RF oscillation output signal generated from an unillustrated RF oscillator. Further, communication data related to the authentication process and cryptographic process from the microcontroller unit (MCU) 11 of the power transmitting circuit 1 are supplied to the power receiving circuit 2 through the RF driver 122, the power transmitting side antenna coil 13 and the power receiving side antenna coil 25.

<<Power Receiving Circuit on the Reception Side>>

As shown in FIG. 1, the power receiving circuit 2 on the reception side of the wireless power transmission system is comprised of a power reception control circuit 21 and the microcontroller unit (MCU) 22. The microcontroller unit (MCU) 22 has the authentication processing function 221 and the cryptographic processing function 222. The power reception control circuit 21 includes a rectifier circuit 211 and the semiconductor integrated circuit 212 for the battery charging control.

In the wireless power transmission system shown in FIG. 1, the communications in accordance with the above communication protocol are first performed between the microcontroller unit (MCU) 11 of the power transmitting circuit 1 and the microcontroller unit (MCU) 22 of the power receiving circuit 2 through the power transmitting side antenna coil 13 and the power receiving side antenna coil 25. For such communications, the power receiving circuit 2 is provided to enable serial communications, the supply of power and the like between the power reception control circuit 21 and the microcontroller unit (MCU) 22. When it is determined by the microcontroller unit (MCU) 11 of the power transmitting circuit 1 that the user of the multifunction cellular phone corresponding to the power receiving circuit 2 is of the user having the legitimate use right, an RF drive signal generated from the RF driver 122 is supplied to the power receiving circuit 2 through the power transmitting side antenna coil 13 and the power receiving side antenna coil 25.

A DC power supply voltage generated by allowing the rectifier circuit 211 to rectify and smooth the RF drive signal supplied via the power transmitting side antenna coil 13 and the power receiving side antenna coil 25 is supplied to the semiconductor integrated circuit 212 and the microcontroller unit (MCU) 22. The DC power supply voltage supplied from the rectifier circuit 211 to the semiconductor integrated circuit 212 is used for the charging of the secondary battery 26 and used even for the supply of power to the power receiving side system 3.

When the power receiving side of the wireless power transmission system is of a multifunction cellular phone, the power receiving side system 3 includes an application processor, a baseband processor, a liquid crystal display driver IC, an RF signal processing semiconductor integrated circuit (RFIC), a main memory, non-volatile memories such as a flash memory and so on, etc.

When the power receiving side of the wireless power transmission system is of a portable personal computer like a tablet PC, the power receiving side system 3 further includes a central processing unit (CPU) and a hard disk replacement type flash memory storage having a massive storage capacity.

Further, the semiconductor integrated circuit 212 for the battery charging control and the supply of power to the system can be supplied with a USB power supply voltage from a USB coupling interface 23 and an AC-DC conversion power supply voltage generated by rectifying and smoothing an AC power supply voltage from an AC power supply coupling interface 24 even other than the DC power supply voltage generated by the rectifier circuit 211. Accordingly, the semiconductor integrated circuit 212 for the battery charging control and the system power supply has the function of automatically selecting power supply voltages for the battery charging control and the supply of power to the system out of a plurality of power supply voltages of the DC power supply voltage of the rectifier circuit 211, the USB power supply voltage from the USB coupling interface 23, and the AC-DC conversion power supply voltage from the AC power supply coupling interface 24. Incidentally, USB is an abbreviation of Universal Serial Bus.

<<Configuration of Semiconductor Integrated Circuit for Battery Charging Control>>

FIG. 2 is a diagram showing a configuration of the semiconductor integrated circuit 212 for the battery charging control according to the first embodiment shown in FIG. 1.

As shown in FIG. 2, the semiconductor integrated circuit 212 for the battery charging control and the supply of power to the system includes a step-down DC-DC converter 2121, a linear regulator 2122, a USB type detection circuit 2123, an input voltage detection circuit 2124, an external interface 2125, a built-in regulator 2126 and a gate drive control circuit 2127. Further, the semiconductor integrated circuit 212 includes a P channel MOS transistor Mp0, and switches SW1, SW2, SW3 and SW4.

A supply terminal T1 for a first input voltage 1 is supplied with a power supply voltage based on a wireless power delivery of the power transmitting circuit 1 through a first Schottky diode D1 and an AC-DC conversion power supply voltage from the AC power supply coupling interface 24 through a second Schottky diode D2. A supply terminal T2 for a second input voltage 2 is supplied with a USB power supply voltage from the USB coupling interface 23. The Schottky diodes D1 and D2 respectively function as backflow preventing devices between the power supply voltage based on the wireless power delivery of the power transmitting circuit 1 and the AC-DC conversion power supply voltage from the AC power supply coupling interface 24 and on the other hand, function as voltage transfer devices which transfer a power supply as a forward voltage low as compared with a PN junction diode. Incidentally, the power supply voltage based on the wireless power delivery of the power transmitting circuit 1 is a voltage that ranges from 5.5V to 20V. The AC-DC conversion power supply voltage from the AC power supply coupling interface 24 is a voltage of approximately 7V. The USB power supply voltage from the USB coupling interface 23 is a voltage of 5V.

An inductor L1 and a capacitor C1 are coupled to the step-down DC-DC converter 2121 through external terminals DDOUT1 (T5) and DDOUT2 (T6). Thus, the step-down DC-DC converter 2121 operates as a switching regulator slower in startup at power-on than the linear regulator 2122 but has power efficiency higher than the linear regulator 2122. On the other hand, the linear regulator 2122 operates as a series regulator which operates at once immediately after power-on.

That is, the step-down DC-DC converter 2121 and the linear regulator 2122 generate a system supply voltage ranging from 3.5V to 5V from the power supply voltage of 5.5V to 20V for the wireless power delivery of the power transmitting circuit 1 or from the AC-DC conversion power supply voltage of approximately 7V from the AC power supply coupling interface 24. Thus, the system supply voltage of 5V from the step-down DC-DC converter 2121 and the linear regulator 2122 is supplied to the power receiving side system 3 through the switches SW2 and SW4 and an external terminal SYS (T4). On the other hand, the USB power supply voltage of 5V from the USB coupling interface 23 is supplied to the power receiving side system 3 through the switch SW3 and the external terminal SYS (T4).

The USB type detection circuit 2123 detects from the bit rate of differential data signals D+ and D− of the USB coupling interface 23 or the power delivery capability of the supply terminal T2 for the second input voltage 2 whether the USB coupling interface 23 corresponds to any of USB1.1, USB1.0, USB2.0 and USB3.0.

In order to select the operation mode at the start-up, the input voltage detection circuit 2124 performs the voltage detection of the supply terminal T1 for the first input voltage 1 and the voltage detection of the supply terminal T2 for the second input voltage 2 and further performs on-off control of the switches SW1, SW2, SW3 and SW4 and control of the step-down DC-DC converter 2121, the built-in regulator 2126 and the gate drive control circuit 2127. Further, the input voltage detection circuit 2124 has the function of performing control of the USB type detection circuit 2123 and supplying USB type detection data output from the USB type detection circuit 2123 to the microcontroller unit (MCU) 22 and the power receiving side system 3 through the external interface 2125.

Thus, the external interface 2125 performs interactive communications of a clock and serial data with the power receiving side system 3 and the microcontroller unit (MCU) 22.

The built-in regulator 2126 is supplied with the power supply voltage based on the wireless power delivery of the power transmitting circuit 1 via the step-down DC-DC converter 2121 or the linear regulator 2122 or the AC-DC conversion power supply voltage from the AC power supply coupling interface 24, or the USB power supply voltage from the USB coupling interface 23. As a result, an operating voltage $V_{DD}18$ of 1.8V and an operating voltage $V_{DD}30$ of 3.0V are generated from the built-in regulator 2126 and supplied to the microcontroller unit (MCU) 22.

The P channel MOS transistor Mp0 is drive-controlled to an on state by the input voltage detection circuit 2124 and the gate drive control circuit 2127 to thereby supply a system supply voltage ranging from 3.5V to 5V at the external terminal SYS (T4) to the secondary battery 26 through an external terminal BAT (T3), whereby the charging of the secondary battery 26 is performed. For example, the secondary battery 26 is a lithium ion battery built in a multifunction cellular phone or the like, and its charging current becomes a relatively large current ranging from about 0.5 A to about 1.0 A.

Further, the gate drive control circuit 2127 generates an output signal for driving the gate of the P channel MOS transistor Mp0 in such a manner that the P channel MOS transistor Mp0 is brought into conduction bidirectionally between the external terminal SYS (T4) and the external terminal BAT (T3). Thus, during the execution of charging of the secondary battery 26, the charging current of the secondary battery 26 flows from the external terminal SYS (T4) to the external terminal BAT (T3). On the other hand, contrary to this, the discharging current of the secondary battery 26 flows from the external terminal BAT (T3) to the external terminal SYS (T4) during a battery operating period by the discharge of the secondary battery 26. Furthermore, the gate drive control circuit 2127 has the function of performing current control of charging and discharging currents during the charging and discharging operations of the secondary battery 26 to thereby prevent overcharging and overdischarging.

<<Functions of External Terminals of Semiconductor Integrated Circuit>>

FIG. 3 is a diagram showing the functions of the external terminals of the semiconductor integrated circuit 212 for the battery charging control according to the first embodiment shown in FIG. 2.

As shown in FIG. 3, the external supply terminal for the first input voltage 1 has the function of supplying the power supply voltage based on the wireless power delivery of the power transmitting circuit 1 or the AC-DC conversion power supply voltage from the AC power supply coupling interface 24 through the first Schottky diode D1 and the second Schottky diode D2.

Further, the external supply terminal for the second input voltage 2 has the function of supplying the USB power supply voltage from the USB coupling interface 23.

The external supply terminal for the differential data signal D+ has the function of supplying a non-inversion input signal D+ of differential data for the USB coupling interface 23.

Further, the external supply terminal for the differential data signal D− has the function of supplying an inversion input signal D− of differential data for the USB coupling interface 23.

The external input/output terminal for the clock has the function of performing an interactive communication of the clock for the external interface 2125.

In addition, the external input/output terminal for the serial data has the function of performing an interactive communication of the serial data for the external interface 2125.

The external terminal DDOUT1 has the function of outputting a switching output signal based on a switching regulator operation at the step-down DC-DC converter 2121.

Further, the external terminal DDOUT2 has the function of outputting an output voltage of the step-down DC-DC converter 2121, which has passed through a low-pass filter comprised of the inductor L1 and the capacitor C1.

The external terminal SYS has the function of outputting a power supply voltage to the power receiving side system 3.

The external terminal BAT has the function of coupling the secondary battery 26.

The external terminal $V_{DD}18$ has the function of outputting an operating voltage $V_{DD}18$ of 1.8V to the microcontroller (MCU) 22.

The external terminal $V_{DD}30$ has the function of outputting an operating voltage $V_{DD}30$ of 3.0V to the microcontroller (MCU) 22.

<<Configuration of Input Voltage Detection Circuit of Semiconductor Integrated Circuit>>

FIG. 4 is a diagram showing the configuration of the input voltage detection circuit 2124 for selecting an operation mode at the startup of the semiconductor integrated circuit 212 according to the first embodiment shown in FIG. 2.

As shown in FIG. 4, the input voltage detection circuit 2124 includes a linear regulator 21241, an input voltage selection switch 21242, a voltage comparison/selection circuit 21243, a first reference voltage generator Ref_Gen1, a first buffer circuit BA1, a second buffer circuit BA2 and a power-on reset circuit 21244. Further, the input voltage detection circuit 2124 includes a control logic circuit 21245, an input voltage selection switch control logic circuit 21246, a clock generator 21247, an input voltage detection circuit 21248 and a gate drive circuit 21249.

As shown in the upper left part of FIG. 4, the supply terminal T1 for the input voltage 1 is supplied with the power supply voltage based on the wireless power delivery of the power transmitting circuit 1 and the AC-DC conversion power supply voltage from the AC power supply coupling interface 24. The supply terminal T2 for the second input voltage 2 is supplied with the USB power supply voltage from the USB coupling interface 23.

The power supply voltage based on the wireless power delivery, having the voltage ranging from 5.5V to 20V or the AC-DC conversion power supply voltage at the supply terminal T1 for the first input voltage 1 is converted to an output power supply voltage Vout of approximately 5V by the linear regulator 21241. The output power supply voltage of approximately 5V is supplied to the source of the P channel MOS transistor Mp1 of the input voltage selection switch 21242 and the gate drive circuit 21249.

The USB power supply voltage from the USB coupling interface 23, having the voltage of 5V supplied to the supply terminal T2 for the second input voltage 2 is supplied to the source of the P channel MOS transistor Mp2 of the input voltage selection switch 21242.

The gate of the P channel MOS transistor Mp1 of the input voltage selection switch 21242 is driven by a first gate drive output signal Mp1_G of the gate drive circuit 21249. The gate of the P channel MOS transistor Mp2 of the input voltage selection switch 21242 is driven by a second gate drive output signal Mp2_G of the gate drive circuit 21249. During a power on rest period to be described in detail below at the power-on, the first gate drive output signal Mp1_G and the second gate drive output signal Mp2_G of the gate drive circuit 21249 are both set to a low level. Therefore, the P channel MOS transistor Mp1 and P channel MOS transistor Mp2 of the input voltage selection switch 21242 are both controlled to an on state.

The voltage comparison/selection circuit 21243 is comprised of a P channel MOS transistor Mp3, a P channel MOS transistor Mp4 and a differential amplifier DA1. Thus, the voltage comparison/selection circuit 21243 compares the voltage of a first node Node1 and the voltage of a second node Node2 and thereby selects a high voltage of the two voltages thereof and generates it as an output voltage Vcc. The first node Node1 is coupled to the drain of the P channel MOS transistor Mp3 and an inversion input terminal− of the differential amplifier DA1. The second node Node2 is coupled to the drain of the P channel MOS transistor Mp4 and a non-inversion input terminal+ of the differential amplifier DA1. A non-inversion output terminal+ and an inversion output terminal− of the differential amplifier DA1 are respectively coupled to the gate of the P channel MOS transistor Mp3 and the gate of the P channel MOS transistor Mp4. The source of the P channel MOS transistor Mp3 and the source of the P channel MOS transistor Mp4 are coupled in common to generate the output voltage Vcc.

The output voltage Vcc of the voltage comparison/selection circuit 21243 is supplied to the differential amplifier DA1, the first reference voltage generator Ref_Gen1, the first buffer circuit BA1 and the second buffer circuit BA2 as an operating power supply voltage.

The first reference voltage generator Ref_Gen1 allows the output voltage Vcc output from the voltage comparison/selection circuit 21243 to function as an operating power supply voltage to thereby generate a reference voltage $V_{REF}$.

The first buffer circuit BA1 and the second buffer circuit BA2 respectively generate an analog circuit power supply voltage $AV_{DD}$ and a digital circuit power supply voltage $DV_{DD}$ proportional to the level of the reference voltage $V_{REF}$ in response to the reference voltage $V_{REF}$ generated from the first reference voltage generator Ref_Gen1.

The power-on reset circuit 21244 is comprised of a second reference voltage generator Ref_Gen2, a differential amplifier DA2, a resistor Rp, a capacitor Cp and a third buffer circuit BA3. The second reference voltage generator Ref_Gen2 and differential amplifier DA2 of the power-on reset circuit 21244 are supplied with the digital circuit power supply voltage $DV_{DD}$ generated by the second buffer circuit BA2. A non-inversion input terminal+ and inversion input terminal− of the differential amplifier DA2 are respectively supplied with the digital circuit power supply voltage $DV_{DD}$ and a reference voltage $V_{BB}$ generated from the second reference voltage generator Ref_Gen2.

An output voltage of the differential amplifier DA2 of the power-on reset circuit 21244 is supplied to one end of the resistor Rp. The other end of the resistor Rp is coupled to one end of the capacitor Cp and an input terminal of the third buffer circuit BA3. The other end of the capacitor Cp is coupled to a ground potential. A power on reset signal POR of a low level generated from the third buffer circuit BA3 during the power on reset period is supplied to an inversion reset input terminal/Reset of the control logic circuit 21245 and an inversion reset input terminal/Reset of the input voltage selection switch control logic circuit 21246.

A clock signal generated from the clock generator 21247 supplied with the output voltage Vcc delivered from the voltage comparison/selection circuit 21243 and the digital circuit power supply voltage $DV_{DD}$ delivered from the second buffer circuit BA2 is supplied to a clock input terminal CLK of the control logic circuit 21245 and a clock input terminal CLK of the input voltage selection switch control logic circuit 21246.

The control logic circuit 21245 of the input voltage detection circuit 2124 controls the whole operation of the semiconductor integrated circuit 212 according to the first embodiment shown in FIG. 2. That is, an analog circuit 2128 coupled to the input voltage detection circuit 2124 shown in FIG. 4 includes analog circuits of the step-down DC-DC converter 2121, linear regulator 2122, USB type detection circuit 2123, built-in regulator 2126 and gate drive control circuit 2127 of the semiconductor integrated circuit 212 shown in FIG. 2. Thus, the operations of these analog circuits are all controlled by the control logic circuit 21245 of the input voltage detection circuit 2124 shown in FIG. 4. Incidentally, the analog circuit 2128 is supplied with the output voltage Vcc delivered from the voltage comparison/selection circuit 21243 and the analog circuit power supply voltage $AV_{DD}$ output from the first buffer circuit BA1.

Further, likewise, the operation of the input voltage selection switch control logic circuit 21246 is also controlled by the control logic circuit 21245 of the input voltage detection circuit 2124 shown in FIG. 4.

Furthermore, likewise, the operations of the switches SW1, SW2, SW3 and SW4, built-in regulator 2126 and gate drive control circuit 2127 shown in FIG. 2 are also controlled by the control logic circuit 21245 of the input voltage detection circuit 2124 shown in FIG. 4.

The input voltage detection circuit 21248 is supplied with the output voltage Vcc delivered from the voltage comparison/selection circuit 21243 and the analog circuit power supply voltage $AV_{DD}$ output from the first buffer circuit BA1. After the elapse of the power on reset period, the input voltage detection circuit 21248 detects the level of the power supply voltage based on the wireless power delivery or AC-DC conversion at the supply terminal T1 for the first input voltage 1, and the level of the USB power supply voltage at the supply terminal T2 for the second input voltage 2. As a result, voltage detection output signals Vdet1 and Vdet2 of 2 bits output from the input voltage detection circuit 21248 are supplied to the control logic circuit 21245 and the input voltage selection switch control logic circuit 21246. That is, the voltage detection output signal Vdet1 indicates a result of detection of the presence or absence of the supply of the power supply voltage based on the wireless power delivery or AC-DC conversion to the supply terminal T1 for the first input voltage 1. Also the voltage detection output signal Vdet2 indicates a result of detection of the presence or absence of the supply of the USB power supply voltage to the supply terminal T2 for the second input voltage 2.

After the elapse of the power on reset period, one of the first gate drive output signal Mp1_G and second gate drive output signal Mp2_G of the gate drive circuit 21249 and the other thereof are respectively set to a low level and a high level by signals output from the input voltage selection switch control logic circuit 21246 that has responded to the 2-bit voltage detection output signals Vdet1 and Vdet2, whereby the automatic selection of a power supply to be used is carried out.

Consider where the supply of the power supply voltage to the supply terminal T1 for the first input voltage 1 is detected by the high-level voltage detection output signal Vdet1, and the non-supply of the power supply voltage to the supply terminal T2 for the second input voltage 2 is detected by the low-level voltage detection output signal Vdet2. In this case, in response to the voltage detection output signals Vdet1 and Vdet2 different in level, the control logic circuit 21245 controls the switch SW2 lying inside the semiconductor integrated circuit 212 according to the first embodiment shown in FIG. 2 to an on state and on the other hand, controls the switch SW3 to an off state. As a result, the voltage supplied from the supply terminal T1 for the first input voltage 1 is used for the charging of the secondary battery 26 via the step-down DC-DC converter 2121, the switch SW2 and the P channel MOS transistor Mp0 and used for the supply of power to the power receiving side system 3. Further, in this case, the gate drive circuit 21249 sets the first gate drive output signal Mp1_G and the second gate drive output signal Mp2_G to low and high levels respectively. In addition, the voltage comparison/selection circuit 21243 detects that the voltage of the first node Node1 is higher than that of the second node Node2 and generates the voltage of the first node Node1 supplied from the supply terminal T1 for the first input voltage 1, as the output voltage Vcc of the voltage comparison/selection circuit 21243.

Consider where the non-supply of the power supply voltage to the supply terminal T1 for the first input voltage 1 is detected by the low-level voltage detection output signal Vdet1, and the supply of the power supply voltage to the supply terminal T2 for the second input voltage 2 is detected by the high-level voltage detection output signal Vdet2. In this case, in response to the voltage detection output signals Vdet1 and Vdet2 different in level, the control logic circuit 21245 controls the switch SW2 lying inside the semiconductor integrated circuit 212 according to the first embodiment shown in FIG. 2 to an off state and on the other hand, controls the switch SW3 to an on state. As a result, the voltage supplied from the supply terminal T2 for the second input voltage 2 is used for the charging of the secondary battery 26 via the switch SW3 and the P channel MOS transistor Mp0 and used for the supply of power to the power receiving side system 3. Further, in this case, the gate drive circuit 21249 sets the first gate drive output signal Mp1_G and the second gate drive output signal Mp2_G to high and low levels respectively. In addition, the voltage comparison/selection circuit 21243 detects that the voltage of the second node Node2 is higher that that of the first node Noded1 and generates the voltage of the second node Node2 supplied from the supply terminal T2 for the second input voltage 2, as the output voltage Vcc of the voltage comparison/selection circuit 21243.

Consider where the supply of the power supply voltage based on the wireless power delivery or AC-DC conversion to the supply terminal T1 for the first input voltage 1 and the supply of the USB power supply voltage to the supply terminal T2 for the second input voltage 2 are simultaneously detected by the 2-bit voltage detection output signals Vdet1 and Vdet2 of the input voltage detection circuit 21248. In this case, in response to the voltage detection output signals Vdet1 and Vdet2 both high in level, the control logic circuit 21245 adjusts the level of the output power supply voltage Vout of approximately 5V of the linear regulator 21241.

That is, when the supply voltage of the supply terminal T1 for the first input voltage 1, which has been detected simultaneously with the supply voltage of the supply terminal T2 for the second input voltage 2, takes precedence over the supply voltage of the supply terminal T2 for the second input voltage 2, the output power supply voltage Vout of approximately 5V of the linear regulator 21241 is set to, for example, 5.2V higher than the USB power supply voltage from the USB coupling interface 23, having the voltage of 5V supplied to the supply terminal T2 for the second input voltage 2. Further, the first gate drive output signal Mp1_G and second gate drive output signal Mp2_G of the gate drive circuit 21249 controlled by the control logic circuit 21245 are set to low and high levels respectively. As a result, the voltage comparison/selection circuit 21243 detects that the voltage of the first Node1 is higher than that of the second node Node2 and generates the supply voltage of the supply terminal T1 for the first input voltage 1 as the output voltage Vcc of the voltage comparison/selection circuit 21243. Further, the control logic circuit 21245 controls the switch SW2 lying inside the semiconductor integrated circuit 212 according to the first embodiment shown in FIG. 2 to an on state and on the other hand, controls the switch SW3 to an off state. As a result, the voltage supplied from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3.

Contrary to this, when the supply voltage of the supply terminal T2 for the second input voltage 2 takes higher priority than the supply voltage of the supply terminal T1 for the first input voltage 1, the output power supply voltage Vout of approximately 5V of the linear regulator 21241 is set to, for example, 4.8V lower than the USB power supply voltage from the USB coupling interface 23, having the voltage of 5V supplied to the supply terminal T2 for the second input voltage 2. Further, the first gate drive output signal Mp1_G and second gate drive output signal Mp2_G of the gate drive circuit 21249 controlled by the control logic circuit 21245 are set to high and low levels respectively. As a result, the voltage comparison/selection circuit 21243 detects that the voltage of the second Node2 is higher than that of the first Node Node1 and generates the voltage of the second node Node2 from the supply terminal T2 for the second input voltage 2 as the output voltage Vcc of the voltage comparison/selection circuit 21243. Further, the control logic circuit 21245 controls the switch SW2 lying inside the semiconductor integrated circuit 212 according to the first embodiment shown in FIG. 2 to an off state and on the other hand, controls the switch SW3 to an on state. As a result, the voltage supplied from the supply terminal T2 for the second input voltage 2 is used for the charging of the secondary battery 26 through the switch SW3 and the P channel MOS transistor Mp0 and used for the supply of power to the power receiving side system 3.

On the other hand, before the elapse of the power on reset period, the first gate drive output signal Mp1_G and second gate drive output signal Mp2_G of the gate drive circuit 21249 are both set to the low level by the output signal of the input voltage selection switch control logic circuit 21246 that has responded to the low-level power on reset signal POR. As a result, the P channel MOS transistor Mp1 and the P channel MOS transistor Mp2 included in the input voltage selection switch 21242 are both controlled to an on state.

<<Automatic Selecting Operation of used Voltage>>

FIG. 5 is a diagram showing the operation of automatically selecting a power supply to be used from a plurality of power supplies by the semiconductor integrated circuit 212 according to the first embodiment shown in FIGS. 2 and 4.

As shown in Step S500 of FIG. 5, in an initial setting state before the power supply voltages are supplied to the supply terminal T1 for the first input voltage 1 and the supply terminal T2 for the second input voltage 2, the first gate drive output signal Mp1_G and second gate drive output signal Mp2_G of the gate drive circuit 21249 are both set to a low level. As a result, the P channel MOS transistor Mp1 and P channel MOS transistor Mp2 of the input voltage selection switch 21242 are both controlled to an on state.

At the next Step S501, at least either of the supply terminal T1 for the first input voltage 1 and the supply terminal T2 for the second input voltage 2 is supplied with the power supply voltage. That is, the supply terminal T1 for the first input voltage 1 is supplied with the power supply voltage based on the wireless power delivery of the power transmitting circuit 1 and the AC-DC conversion power supply voltage from the AC power supply coupling interface 24. Alternatively, the supply terminal T2 for the second input voltage 2 is supplied with the USB power supply voltage from the USB coupling interface 23.

At the next Step S502, since the digital circuit power supply voltage $DV_{DD}$ rises in response to the supply of power at Step S501, the power on reset operation by the power-on reset circuit 21244 is performed.

When the power on reset operation at Step S502 is ended, the detection of a plurality of power supply voltages is performed at the next Step S503. That is, at Step S503, the input voltage detection circuit 21248 detects the level of the power supply voltage based on the wireless power delivery or AC-DC conversion at the supply terminal T1 for the first input voltage 1 and the level of the USB power supply voltage of the supply terminal T2 for the second input voltage 2. As a result, voltage detection output signals Vdet1 and Vdet2 of two bits are generated from the input voltage detection circuit 21248. The voltage detection output signal Vdet1 indicates a result of detection of the presence or absence of the supply of the power supply voltage based on the wireless power delivery or AC-DC conversion to the supply terminal T1 for the first input voltage 1. The voltage detection output signal Vdet2 indicates a result of detection of the presence or absence of the supply of the USB power supply voltage to the supply terminal T2 for the second input voltage 2.

When, upon the detection of the power supply voltages at above Step S503, only the supply of the power supply voltage to the supply terminal T1 for the first input voltage 1 is detected, and the supply of the power supply voltage to the supply terminal T2 for the second input voltage 2 is not detected, the process for the automatic selecting operation proceeds to Step S504.

That is, at the next Step S505, the gate drive circuit 21249 sets the first gate drive output signal Mp1_G and the second gate drive output signal Mp2_G to low and high levels respectively in response to the detection of only the wireless power delivery at Step S504. Thus, since the P channel MOS transistor Mp1 and P channel MOS transistor Mp2 of the input voltage selection switch 21242 are respectively controlled to the on and off states, the initial operation of the wireless power delivery is started. Further, at this Step S505, the control logic circuit 21245 controls the switch SW2 lying inside the semiconductor integrated circuit 212 according to the first embodiment shown in FIG. 2 to an on state and on the other hand, controls the switch SW3 to an off state. Thus, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3.

When, upon the detection of the power supply voltages at above Step S503, only the supply of the power supply voltage to the supply terminal T2 for the second input voltage 2 is detected, and the supply of the power supply voltage to the supply terminal T1 for the first input voltage 1 is not detected, the process for the automatic selecting operation proceeds to Step S506.

That is, at the next Step S507, the gate drive circuit 21249 sets the first gate drive output signal Mp1_G and the second gate drive output signal Mp2_G to high and low levels respectively in response to the detection of only the USB power delivery at Step S506. Thus, since the P channel MOS transistor Mp1 and P channel MOS transistor Mp2 of the input voltage selection switch 21242 are respectively controlled to the off and on states, the initial operation of the USB power delivery is started. Further, at this Step S507, the control logic circuit 21245 controls the switch SW2 lying inside the semiconductor integrated circuit 212 according to the first embodiment shown in FIG. 2 to an off state and on the other hand, controls the switch SW3 to an on state. Thus, the supply voltage based on the USB power delivery from the supply terminal T2 for the second input voltage 2 is used for the charging of the secondary battery 26 through the switch SW3 and the P channel MOS transistor Mp0 and used for the supply of power to the power receiving side system 3.

When, upon the detection of the power supply voltages at above Step S503, both of the supply of the power supply voltage to the supply terminal T1 for the first input voltage 1 and the supply of the power supply voltage to the supply terminal T2 for the second input voltage 2 are detected, the process for the automatic selecting operation proceeds to Step S508.

That is, at the next Step S509, in response to the detection of both of the wireless power delivery and the USB power delivery at Step S508, the gate drive circuit 21249 sets the first gate drive output signal Mp1_G and the second gate drive output signal Mp2_G to low and high levels respectively to give higher priority to the wireless power delivery than the USB power delivery. Accordingly, since the P channel MOS transistor Mp1 and P channel MOS transistor Mp2 of the input voltage selection switch 21242 are respectively controlled to the on and off states, the initial operation of the wireless power delivery is started. Further, at this Step S509, the control logic circuit 21245 controls the switch SW2 lying inside the semiconductor integrated circuit 212 according to the first embodiment shown in FIG. 2 to an on state and on the other hand, controls the switch SW3 to an off state. Accordingly, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3. Thus, the reason why the wireless power delivery is given priority over the USB power delivery at Step S509, is that the current drive capability of the wireless power delivery from the power receiving circuit 2 through the power transmitting side antenna coil 13 and the power receiving side antenna coil 25 is generally higher than that of the USB coupling interface 23.

[Second Embodiment]

<<Another Operation of Automatically Selecting Voltage to be Used>>

FIG. 6 is a diagram showing the operation of automatically selecting a used power supply out of a plurality of power supplies by the semiconductor integrated circuit 212 according to a second embodiment shown in FIGS. 2 and 4.

The semiconductor integrated circuit 212 according to the first embodiment shown in FIGS. 2 and 4 has carried out the initial operation of first automatically selecting the power supply to be used out of the power supplies as shown in FIG. 5.

The semiconductor integrated circuit 212 according to the second embodiment shown in FIGS. 2 and 4 to be next described is capable of, as shown in FIG. 6, performing an initial operation of first automatically selecting a used power supply from a plurality of power supplies and performing a succeeding operation of further automatically selecting a used voltage even upon the additional supply of subsequent power supply voltages.

Since the contents of operations at respective Steps S500 through S509 shown in FIG. 6 according to the second embodiment are exactly the same as the contents of the operations at the respective Steps S500 through S509 described in FIG. 5 according to the first embodiment, their description will be omitted.

After the initial operation of the wireless power delivery at Step S505 shown in FIG. 6, a USB power supply voltage from the USB coupling interface 23 to the supply terminal T2 for the second input voltage 2 is supplied at the next Step S600. As a result, at this Step S600, the detection of the USB power delivery is added after the detection of the wireless power delivery.

At the next Step S601 subsequent to the additional detection of the USB power delivery at Step S600, the gate drive circuit 21249 sets a first gate drive output signal Mp1_G and a second gate drive output signal Mp2_G to low and high levels respectively to give higher priority to the wireless power delivery than the USB power delivery exactly as with Step S509 of FIG. 5 according to the first embodiment. Accordingly, at Step S601, the P channel MOS transistor Mp1 and P channel MOS transistor Mp2 of the input voltage selection switch 21242 are respectively controlled to an on state and an off state. The continuous operation of the wireless power delivery is therefore started. Further, at this Step S601, the control logic circuit 21245 holds the switch SW2 lying inside the semiconductor integrated circuit 212 according to the first embodiment shown in FIG. 2 in an on state and on the other hand, holds the switch SW3 in an off state. Accordingly, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3. Thus, the reason why the wireless power delivery is given higher priority than the USB power delivery even at Step S601 is that the current drive capability of the wireless power delivery from the power receiving circuit 2 through the power transmitting side antenna coil 13 and the power receiving side antenna coil 25 shown in FIG. 1 is generally higher than that of the USB coupling interface 23.

After the initial operation of the USB power delivery at Step S507 shown in FIG. 6, a power supply voltage based on the wireless power delivery of the power transmitting circuit 1 to the supply terminal T1 for the first input voltage 1 is supplied at the next Step S602. As a result, at this Step S602, the detection of the wireless power delivery is added after the detection of the USB power delivery.

At the next Step S603 subsequent to the additional detection of the wireless power delivery at Step S602, the gate drive circuit 21249 changes the first gate drive output signal Mp1_G from the high to low levels and changes the second gate drive output signal Mp2_G from the low to high levels to give higher priority to the wireless power delivery than the USB power delivery. As a result, at Step S603, the operation of switching from the USB power delivery to the wireless power delivery is executed. At this Step S603, the control logic circuit 21245 changes the switch SW2 lying inside the semiconductor integrated circuit 212 according to the first embodiment shown in FIG. 2 from the off to on state and on the other hand, changes the switch SW3 from the on to off state. As a result, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3. Thus, the reason why the wireless power delivery is given higher priority than the USB power delivery even at Step S603 is that the current drive capability of the wireless power delivery from the power receiving circuit 2 through the power transmitting side antenna coil 13 and the power receiving side antenna coil 25 is generally higher than that of the USB coupling interface 23.

After the initial operation of the wireless power delivery at Step S509 shown in FIG. 6, a USB power supply voltage from the USB coupling interface 23 to the supply terminal T2 for the second input voltage 2 is supplied at the next Step S604. As a result, at this Step S604, the redetection of the USB power delivery is added after the detection of the wireless power delivery.

At the next Step S605 subsequent to the redetection of the USB power delivery at Step S604, the gate drive circuit 21249 sets the first gate drive output signal Mp1_G and the second gate drive output signal Mp2_G to low and high levels respectively to give higher priority to the wireless power delivery than the USB power delivery exactly as with Step S509 of FIG. 5 according to the first embodiment. Accordingly, at Step S605, the P channel MOS transistor Mp1 and P channel MOS transistor Mp2 of the input voltage selection switch 21242 are respectively controlled to an on state and an off state. The continuous operation of the wireless power delivery is therefore started. Further, at this Step S605, the control logic circuit 21245 holds the switch SW2 lying inside the semiconductor integrated circuit 212 according to the first embodiment shown in FIG. 2 in an on state and on the other hand, holds the switch SW3 in an off state. Accordingly, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3. Thus, the reason why the wireless power delivery is given higher priority than the USB power delivery even at Step S601 is that the current drive capability of the wireless power delivery from the power receiving circuit 2 through the power transmitting side antenna coil 13 and the power receiving side antenna coil 25 shown in FIG. 1 is generally higher than that of the USB coupling interface 23.

<<Waveform Diagrams of Respective Parts in Semiconductor integrated Circuit>>

Figure 7:
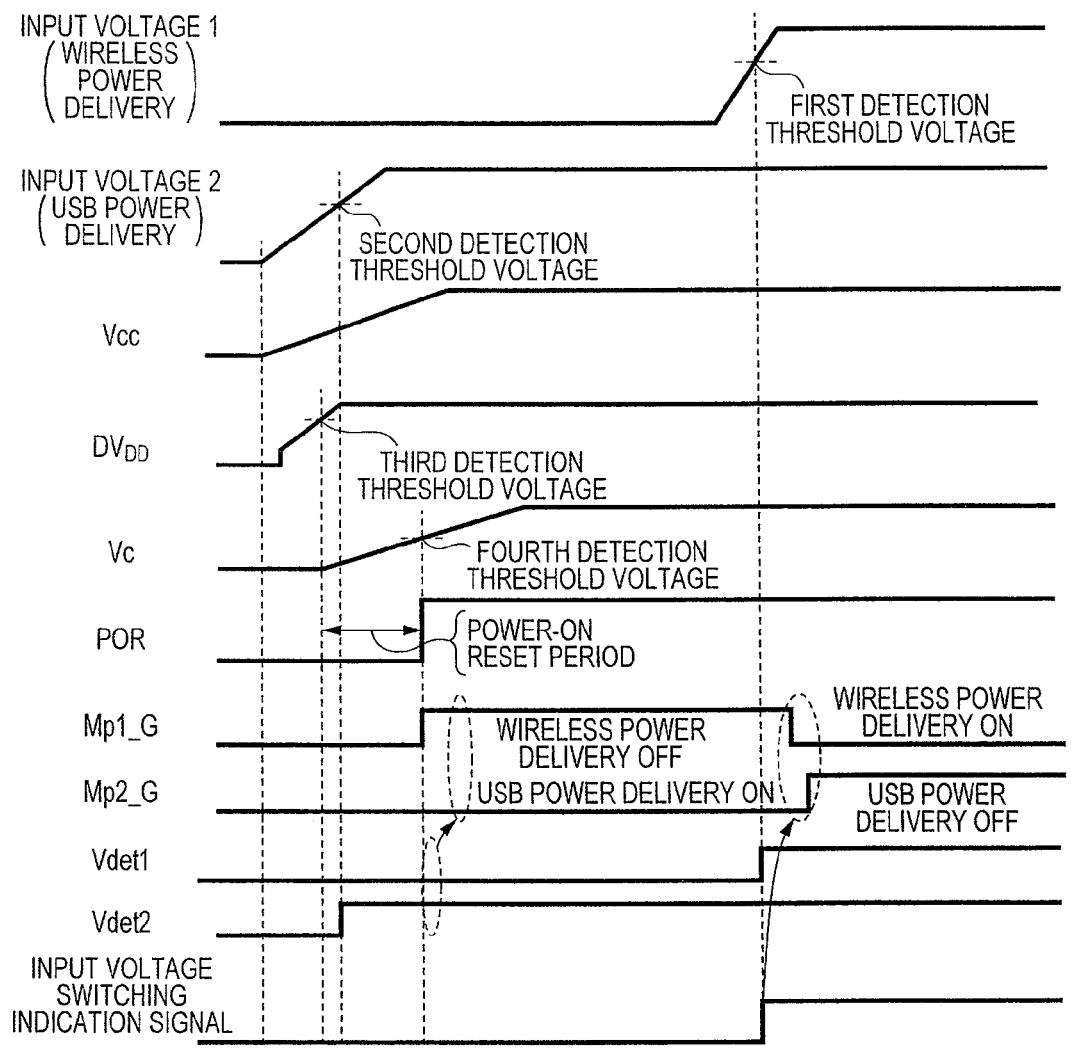
FIG. 7 is a diagram showing waveforms of respective parts of the semiconductor integrated circuit 212 according to the second embodiment shown in FIGS. 2 and 4 at Steps S506, S507, S602 and S603 during the operation of automatically selecting the power supply to be used out of the power supplies according to the second embodiment shown in FIG. 6.

FIG. 7 is a diagram showing the waveforms of the respective parts in the semiconductor integrated circuit 212 according to the second embodiment shown in FIGS. 2 and 4 at Steps S506, S507, S602 and S603 in the operation of automatically selecting the used power supply out of the power supplies according to the second embodiment shown in FIG. 6.

As shown in FIG. 7, a rise in the USB power supply voltage of the supply terminal T2 for the second input voltage 2 is started by the supply of the power supply voltage to the supply terminal T2 for the second input voltage 2 at Step S506. When the rise in the USB power supply voltage reaches a second detection threshold voltage, a voltage detection output signal Vdet2 of the input voltage detection circuit 21248 changes from a low to high levels.

A rise in the output voltage Vcc of the voltage comparison/selection circuit 21243 is started in response to the rise in the USB power supply voltage. Further, a rise in the digital circuit power supply voltage $DV_{DD}$ generated from the second buffer circuit BA2 is started in response to the rise in the output voltage Vcc of the voltage comparison/selection circuit 21243. When the digital circuit power supply voltage $DV_{DD}$ reaches a third detection threshold voltage corresponding to the reference voltage $V_{BB}$ of the second reference voltage generator Ref_Gen2, the output of the differential amplifier DA2 of the power-on reset circuit 21244 changes from a low to high levels, so that a power on reset period based on the charge of a resistor Rp and a capacitor Cp in a time constant circuit is started. When the terminal voltage Vc applied across the capacitor Cp of the time constant circuit reaches a fourth detection threshold voltage corresponding to the threshold voltage of the third buffer circuit BA3, a power on reset signal POR changes from a low to high levels so that the power on reset operation of the control logic circuit 21245 and the input voltage selection switch control logic circuit 21246 is completed.

With the end of the power on reset operation, the input voltage detection circuit 21248 is responsive to the low-level voltage detection output signal Vdet1 and high-level voltage detection output signal Vdet2 of the input voltage detection circuit 21248. Accordingly, the first gate drive output signal Mp1_G and the second gate drive output signal Mp2_G are respectively set to high and low levels by control made by the input voltage selection switch control logic circuit 21246 and the gate drive circuit 21249. Accordingly, since the P channel MOS transistor Mp1 and P channel MOS transistor Mp2 of the input voltage selection switch 21242 are respectively controlled to off and on states, the wireless power delivery is controlled to an off state, and the USB power delivery is controlled to an on state, whereby the automatic selection of the power supply to be used is performed.

In this state, a rise in the power supply voltage based on the wireless power delivery from the supply terminal T1 for the first input voltage 1 is started by the supply of the power supply voltage to the supply terminal T1 for the first input voltage 1 at Step S602 of FIG. 6. When the rise in the power supply voltage based on the wireless power delivery reaches a first detection threshold voltage, the voltage detection output signal Vdet1 of the input voltage detection circuit 21248 changes from a low to high levels.

In response to both high-level voltage detection output signals Vdet1 and Vdet2 of the input voltage detection circuit 21248, an input voltage switching indication signal supplied from the control logic circuit 21245 to the input voltage selection switch control logic circuit 21246 changes from a low to high levels. With the control made by the input voltage selection switch control logic circuit 21246 and the gate drive circuit 21249 responsive to the change of the input voltage switching indication signal from the low level to the high level, the first gate drive output signal Mp1_G changes from a high to low levels and on the other hand, the second gate drive output signal Mp2_G changes from a low to high levels. As a result, in the input voltage selection switch 21242, the P channel MOS transistor Mp1 is changed from an off state to an on state, whereas the P channel MOS transistor Mp2 is changed from an on state to an off state. Further, since the switch SW2 lying inside the semiconductor integrated circuit 212 is brought to an on state and the switch SW3 is brought to an off state, the USB power delivery low in priority is controlled to an off state, and the wireless power delivery high in priority is controlled to an on state.

[Third Embodiment]

<<Another Automatic Selecting Operation of Voltage to be Used>>

FIG. 8 is a diagram showing the operation of automatically selecting a used power supply out of a plurality of power supplies by the semiconductor integrated circuit 212 according to a third embodiment shown in FIGS. 2 and 4.

The operation of automatically selecting the used power supply from the power supplies according to the second embodiment shown in FIG. 6 has an advantage that the operation can approximately perfectly be carried out inside the semiconductor integrated circuit 212 according to the second embodiment shown in FIGS. 2 and 4, but on the other hand has a problem that the degree of freedom of the automatic selection is low. That is, battery-operated cellular electronic devices such as a multifunction cellular phone, a tablet PC, etc. need to improve the degree of freedom of the operation of automatic selection of the used power supply from the power supplies for the purpose of coping with user's various ideas.

The operation of automatic selection of the used power supply from the power supplies according to the third embodiment shown in FIG. 8 is capable of improving the degree of freedom by a program to the non-volatile memory or the like of the power receiving side system 3 coupled to the semiconductor integrated circuit 212 according to the third embodiment shown in FIGS. 2 and 4. That is, since the non-volatile memory such as the flash memory or the like is coupled to the application processor and the baseband processor of the power receiving side system 3, the degree of freedom of the operation of automatic selection of a used power supply from a plurality of power supplies can be improved using the non-volatile memory.

Since the contents of operations at respective steps from Steps S500 through S604 shown in FIG. 8 according to the third embodiment are exactly the same as the contents of the operations at the respective steps from Steps S500 through S604 described in FIG. 6 according to the second embodiment, their description will omitted.

After the additional detection of the USB power delivery at Step S600 shown in FIG. 8, at the next Step S800, information about the additional detection of the USB power delivery at this Step S600 is notified from the semiconductor integrated circuit 212 to the application processor and baseband processor of the power receiving side system 3 through the external interface 2125.

At the next Step S801 after the notification to the power receiving side system 3 at Step S800, indication information indicative of the presence or absence of switching between the USB power delivery and the wireless power delivery is outputted from the application processor or the baseband processor or the like of the power receiving side system 3.

When the indication information indicative of the switching from the wireless power delivery to the USB power delivery is outputted at Step S801, the gate drive circuit 21249 sets a first gate drive output signal Mp1_G and a second gate drive output signal Mp2_G to high and low levels respectively at the next Step S802. Accordingly, since the P channel MOS transistor Mp1 and P channel MOS transistor Mp2 of the input voltage selection switch 21242 are respectively controlled to an off state and an on state, the operation of switching from the wireless power delivery to the USB power delivery is performed. Further, at this Step S802, the control logic circuit 21245 changes the switch SW2 lying inside the semiconductor integrated circuit 212 according to the third embodiment shown in FIG. 2 from an on state to an off state and on the other hand, changes the switch SW3 from an off state to an on state. Accordingly, the supply voltage based on the USB power delivery from the supply terminal T2 for the second input voltage 2 is used for the charging of the secondary battery 26 through the step-down DC-DC converter 2121, the switch SW2 and the P channel MOS transistor Mp0 and used for the supply of power to the power receiving side system 3.

On the other hand, when non-switching indication information indicative of non-switching from the wireless power delivery to the USB power delivery is outputted at Step S801, the process for the automatic selecting operation is returned to Step S505, where the gate drive circuit 21249 holds the first gate drive output signal Mp1_G and the second gate drive output signal Mp2_G in the low and high levels respectively. Accordingly, since the P channel MOS transistor Mp1 and P channel MOS transistor Mp2 of the input voltage selection switch 21242 are respectively maintained in an on state and an off state, the initial operation of the wireless power delivery is maintained. Further, at this Step S505, the control logic circuit 21245 maintains the switch SW2 lying inside the semiconductor integrated circuit 212 according to the third embodiment shown in FIG. 2 in an on state and on the other hand, holds the switch SW3 in an off state. Accordingly, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3.

After the additional detection of the wireless power delivery at Step S602 shown in FIG. 8, at the next Step S803, information about the additional detection of the wireless power delivery at this Step S602 is notified from the semiconductor integrated circuit 212 to the application processor and baseband processor of the power receiving side system 3 through the external interface 2125.

At the next Step S804 after the notification to the power receiving side system 3 at Step S803, indication information indicative of the presence or absence of switching between the USB power delivery and the wireless power delivery is outputted from the application processor or the baseband processor or the like of the power receiving side system 3.

When the indication information indicative of the switching from the USB power delivery to the wireless power delivery is outputted at Step S804, the gate drive circuit 21249 sets the first gate drive output signal Mp1_G and the second gate drive output signal Mp2_G to low and high levels respectively at the next Step S805. Accordingly, since the P channel MOS transistor Mp1 and P channel MOS transistor Mp2 of the input voltage selection switch 21242 are respectively controlled to an on state and an off state, the operation of switching from the USB power delivery to the wireless power delivery is performed. Further, at this Step S805, the control logic circuit 21245 changes the switch SW2 lying inside the semiconductor integrated circuit 212 according to the third embodiment shown in FIG. 2 from an off state to an on state and on the other hand, changes the switch SW3 from an on state to an off state. Accordingly, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3.

On the other hand, when non-switching indication information indicative of non-switching from the USB power delivery to the wireless power delivery is outputted at Step S804, the process for the automatic selecting operation is returned to Step S507, where the gate drive circuit 21249 holds the first gate drive output signal Mp1_G and the second gate drive output signal Mp2_G to high and low levels respectively. Accordingly, since the P channel MOS transistor Mp1 and P channel MOS transistor Mp2 of the input voltage selection switch 21242 are respectively maintained in an off state and an on state, the initial operation of the USB power delivery is maintained. Further, at this Step S507, the control logic circuit 21245 maintains the switch SW2 lying inside the semiconductor integrated circuit 212 according to the third embodiment shown in FIG. 2 in an off state and on the other hand, holds the switch SW3 in an on state. Accordingly, the supply voltage based on the USB power delivery from the supply terminal T2 for the second input voltage 2 is used for the charging of the secondary battery 26 through the step-down DC-DC converter 2121, the switch SW2 and the P channel MOS transistor Mp0 and used for the supply of power to the power receiving side system 3.

After the additional detection of the USB power delivery at Step S604 shown in FIG. 8, at the next Step S806, information about the additional detection of the USB power delivery at this Step S604 is notified from the semiconductor integrated circuit 212 to the application processor and baseband processor of the power receiving side system 3 through the external interface 2125.

At the next Step S807 after the notification to the power receiving side system 3 at Step S806, indication information indicative of the presence or absence of switching between the USB power delivery and the wireless power delivery is outputted from the application processor or the baseband processor or the like of the power receiving side system 3.

When the indication information indicative of the switching from the wireless power delivery to the USB power delivery is outputted at Step S807, the gate drive circuit 21249 sets the first gate drive output signal Mp1_G and the second gate drive output signal Mp2_G to high and low levels respectively at the next Step S808. Accordingly, since the P channel MOS transistor Mp1 and P channel MOS transistor Mp2 of the input voltage selection switch 21242 are respectively controlled to an off state and an on state, the operation of switching from the wireless power delivery to the USB power delivery is performed. Further, at this Step S808, the control logic circuit 21245 changes the switch SW2 lying inside the semiconductor integrated circuit 212 according to the third embodiment shown in FIG. 2 from an on state to an off state and on the other hand, changes the switch SW3 from an off state to an on state. Accordingly, the supply voltage based on the USB power delivery from the supply terminal T2 for the second input voltage 2 is used for the charging of the secondary battery 26 through the step-down DC-DC converter 2121, the switch SW2 and the P channel MOS transistor Mp0 and used for the supply of power to the power receiving side system 3.

On the other hand, when non-switching indication information indicative of non-switching from the wireless power delivery to the USB power delivery is outputted at Step S807, the process for the automatic selecting operation is returned to Step S509, where the gate drive circuit 21249 maintains the first gate drive output signal Mp1_G and the second gate drive output signal Mp2_G at low and high levels respectively.

Accordingly, since the P channel MOS transistor Mp1 and P channel MOS transistor Mp2 of the input voltage selection switch 21242 are respectively maintained in an on state and an off state, the initial operation of the wireless power delivery is maintained. Further, at this Step S509, the control logic circuit 21245 maintains the switch SW2 lying inside the semiconductor integrated circuit 212 according to the third embodiment shown in FIG. 2 in an on state and on the other hand, holds the switch SW3 in an off state. Accordingly, the supply voltage based on the wireless power delivery from the supply terminal T1 for the first input voltage 1 is used for the charging of the secondary battery 26 through the step-down DC-DC converter 2121, the switch SW2 and the P channel MOS transistor Mp0 and used for the supply of power to the power receiving side system 3.

Although the invention made above by the present inventors has been described specifically on the basis of various embodiments, the present invention is not limited to the embodiments referred to above. It is needless to say that various changes can be made thereto within the scope not departing from the gist thereof.

For example, electronic devices each equipped with the present semiconductor integrated circuit are not limited to portable personal computers like a multifunction cellular phone, a tablet PC and the like, but can be applied to a digital video camera, a digital still camera, a portable music player, a portable DVD player, etc.

Further, the electronic devices each equipped with the present semiconductor integrated circuit are applicable to cellular phones having functions of an automatic ticket system, e-cash and the like in having an RFID card built-in.

What is claimed is:

1. A semiconductor integrated circuit comprising:
 a first supply terminal capable of supplying a first power supply voltage;
 a second supply terminal capable of supplying a second power supply voltage;
 an input voltage selection circuit coupled to the first supply terminal and the second supply terminal;
 a first power supply switch; and
 a second power supply switch,
 wherein the input voltage selection circuit includes a power-on reset circuit, an input voltage detection circuit and a control circuit,
 wherein in response to the supply of the first power supply voltage to the first supply terminal and the supply of the second power supply voltage to the second supply terminal, the power-on reset circuit generates a power on reset signal,
 wherein the input voltage detection circuit generates a first voltage detection output signal in response to the supply of the first power supply voltage to the first supply terminal and generates a second voltage detection output signal in response to the supply of the second power supply voltage to the second supply terminal,
 wherein the control circuit controls the first power supply switch and the second power supply switch in response to the power on reset signal, the first voltage detection output signal and the second voltage detection output signal,
 wherein the input voltage detection circuit detects the supply of the first power supply voltage to the first supply terminal and the supply of the second power supply voltage to the second supply terminal at a timing of a change in the level of the power on reset signal responsive to the end of a power on reset operation of the power-on reset circuit,
 wherein in a first case where at the timing of the change in the level of the power on reset signal, the input voltage detection circuit detects the supply of the first power supply voltage to the first supply terminal but does not detect the supply of the second power supply voltage to the second supply terminal, the control circuit controls the first power supply switch and the second power supply switch to an on state and an off state respectively after the end of the power on reset operation,
 wherein the first power supply switch controlled to the on state supplies the first power supply voltage supplied to the first supply terminal to a load by the control of the first power supply switch and the second power supply switch to the on state and the off state respectively after the end of the power on reset operation,
 wherein in a second case where at the timing of the change in the level of the power on reset signal, the input voltage detection circuit detects the supply of the second power supply voltage to the second supply terminal but does not detect the supply of the first power supply voltage to the first supply terminal, the control circuit controls the first power supply switch and the second power supply switch to an off state and an on state respectively after the end of the power on reset operation,
 wherein the second power supply switch controlled to the on state supplies the second power supply voltage supplied to the second supply terminal to the load by the control of the first power supply switch and the second power supply switch to the off state and the on state respectively after the end of the power on reset operation,
 wherein in a third case where at the timing of the change in the level of the power on reset signal, the input voltage detection circuit detects the supply of the first power supply voltage to the first supply terminal and the supply of the second power supply voltage to the second supply terminal, the control circuit controls one of the first power supply switch and the second power supply switch and the other thereof to an on state and an off state respectively after the end of the power on reset operation,
 wherein in the third case, the one of the first power supply switch and the second power supply switch and the other thereof are respectively controlled to the on state and the off state in accordance with the order of precedence set to the control circuit in advance, and
 wherein the one thereof controlled to the on state supplies the first power supply voltage or the second power supply voltage supplied to the first supply terminal or the second supply terminal to the load.

2. The semiconductor integrated circuit according to claim 1, further including a first external output terminal and a second external output terminal which supply the first power supply voltage or the second power supply voltage to a first external load and a second external load taken as the load respectively; and
 an output P channel MOS transistor coupled between the first external output terminal and the second external output terminal,
 wherein when either of the first power supply switch and the second power supply switch is controlled to an on state after the end of the power on reset operation, the output P channel MOS transistor is controlled to an on state by the control circuit, and
 wherein the control of the output P channel MOS transistor to the on state enables the first power supply voltage or the second power supply voltage to be supplied to the second external load through the output P channel MOS transistor and the second external output terminal.

3. The semiconductor integrated circuit according to claim 2, wherein the first external output terminal is configured so as to be capable of supplying the first power supply voltage or the second power supply voltage to the first external load corresponding to another semiconductor integrated circuit taken as an active device, and wherein the output P channel MOS transistor and the second external output terminal are configured so as to be capable of supplying the first power supply voltage or the second power supply voltage to the second external load taken as a battery.

4. The semiconductor integrated circuit according to claim 3, wherein the input voltage selection circuit further includes an input voltage selection switch and a gate drive circuit, wherein the input voltage selection switch includes a first input P channel MOS transistor and a second input P channel MOS transistor, the first input P channel MOS transistor having a source coupled to the first supply terminal and the second input P channel MOS transistor having a source coupled to the second supply terminal, wherein during a power on reset period of the power-on reset circuit, the gate drive circuit controls both of the first and second input P channel MOS transistors of the input voltage selection switch to an on state, and wherein during the power on reset period, an operating voltage to be supplied to the power-on reset circuit is generated from a drain of the first input P channel MOS transistor or a drain of the second input P channel MOS transistor.

5. The semiconductor integrated circuit according to claim 4, wherein in the first case, the gate drive circuit controls the first and second input P channel MOS transistors of the input voltage selection switch to an on state and an off state respectively, wherein in the second case, the gate drive circuit controls the first and second input P channel MOS transistors of the input voltage selection switch to an on state and an off state respectively, and wherein in the third case, the gate drive circuit controls one of the first and second input P channel MOS transistors of the input voltage selection switch and the other thereof to an on state and an off state respectively in accordance with the order of precedence set to the control circuit in advance.

6. The semiconductor integrated circuit according to claim 5, wherein the input voltage selection circuit further includes a voltage comparison/selection circuit having a first input terminal, a second input terminal and an output terminal, wherein the first input terminal of the voltage comparison/selection circuit is coupled to the drain of the first input P channel MOS transistor of the input voltage selection switch, wherein the second input terminal of the voltage comparison/selection circuit is coupled to the drain of the second input P channel MOS transistor of the input voltage selection switch, wherein the operating voltage supplied to the power-on reset circuit is generated from the output terminal of the voltage comparison/selection circuit, and wherein the voltage comparison/selection circuit compares a voltage of the first input terminal and a voltage of the second input terminal to select a high voltage and thereby outputs the high voltage as the operating voltage supplied from the output terminal to the power-on reset circuit.

7. The semiconductor integrated circuit according to claim 3, wherein with the occurrence of the first case, a fourth case in which the input voltage detection circuit detects the supply of the second power supply voltage to the second supply terminal occurs after the first and second power supply switches are respectively controlled to the on state and the off state after the end of the power on reset operation, wherein in response to the occurrence of the fourth case, the control circuit controls the one of the first power supply switch and the second power supply switch and the other thereof to the on state and the off state respectively in accordance with the order of precedence set to the control circuit in advance, as with the third case, wherein with the occurrence of the second case, a fifth case in which the input voltage detection circuit detects the supply of the first power supply voltage to the first supply terminal occurs after the first and second power supply switches are respectively controlled to the off state and the on state after the end of the power on reset operation, wherein in response to the occurrence of the fifth case, the control circuit controls the one of the first power supply switch and the second power supply switch and the other thereof to the on state and the off state respectively in accordance with the order of precedence set to the control circuit in advance, as with the third case, wherein with the occurrence of the third case, a sixth case in which the input voltage detection circuit detects the supply of the second power supply voltage to the second supply terminal occurs after the one of the first and second power supply switches and the other thereof are respectively controlled to the on state and the off state after the end of the power on reset operation, and wherein in response to the occurrence of the sixth case, the control circuit controls the one of the first power supply switch and the second power supply switch and the other thereof to the on state and the off state respectively in accordance with the order of precedence set to the control circuit in advance, as with the third case.

8. The semiconductor integrated circuit according to claim 3, wherein with the occurrence of the first case, a fourth case in which the input voltage detection circuit detects the supply of the second power supply voltage to the second supply terminal occurs after the first and second power supply switches are respectively controlled to the on state and the off state after the end of the power on reset operation, wherein in response to the occurrence of the fourth case, the semiconductor integrated circuit is capable of notifying the occurrence of the fourth case to said another semiconductor integrated circuit taken as the first external load, wherein in response to a first notice indicative of the occurrence of the fourth case, the control circuit controls the first power supply switch and the second power supply switch in accordance with a first indication supplied from said another semiconductor integrated circuit to the semiconductor integrated circuit, wherein in accordance with the first indication, the control circuit controls the first power supply switch and the second power supply switch to an on state and an off state respectively or controls the first power supply switch and the second power supply switch to an off state and an on state respectively, wherein with the occurrence of the second case, a fifth case in which the input voltage detection circuit detects the supply of the first power supply voltage to the first supply terminal occurs after the first and second power supply switches are respectively controlled to the off state and the on state after the end of the power on reset operation, wherein in response to the occurrence of the fifth case, the semiconductor integrated circuit is capable of notifying the occurrence of the fifth case to said another semiconductor integrated circuit taken as the first external load, wherein in response to a second notice indicative of the occurrence of the fifth case, the control circuit controls the first power supply switch and the second power supply switch in accordance with a second indication supplied from said another semiconductor integrated circuit to the semiconductor integrated circuit, wherein in accordance with the second indication, the control circuit controls the first power supply switch and the second power supply switch to an off state and an on state respectively or controls the first power supply switch and the second power supply switch to an on state and an off state respectively, wherein with the occurrence of the third case, a sixth case in which the input voltage detection circuit detects the supply of the second power supply voltage to the second supply terminal occurs after the one of the first and second power supply switches and the other thereof are respectively controlled to the on state and the off state after the end of the power on reset operation, wherein in response to the occurrence of the sixth case, the semiconductor integrated circuit is capable of notifying the occurrence of the sixth case to said another semiconductor integrated circuit taken as the first external load, wherein in response to a third notice indicative of the occurrence of the sixth case, the control circuit controls the first power supply switch and the second power supply switch in accordance with a third indication supplied from said another semiconductor integrated circuit to the semiconductor integrated circuit, and wherein in accordance with the third indication, the control circuit controls the first power supply switch and the second power supply switch to an on state and an off state respectively or controls the first power supply switch and the second power supply switch to an off state and an on state respectively.

9. The semiconductor integrated circuit according to claim 3, further including a step-down DC-DC converter and a linear regulator coupled in parallel between the first supply terminal and the first power supply switch, wherein the linear regulator operates as a series regulator which quickly operates immediately after power-on based on the supply of the first power supply voltage to the first supply terminal, and wherein the step-down DC-DC converter operates as a switching regulator having power efficiency higher than the linear regulator.

10. The semiconductor integrated circuit according to claim 9, wherein the first supply terminal is configured so as to be capable of supplying a power supply voltage based on a wireless power delivery to the first supply terminal through a first Schottky diode and an AC-DC conversion power supply voltage of an AC power supply coupling interface thereto through a second Schottky diode, and wherein the second supply terminal is configured so as to be capable of supplying a USB power supply voltage of a USB coupling interface to the second supply terminal.

11. An operating method of a semiconductor integrated circuit equipped with a first supply terminal capable of supplying a first power supply voltage, a second supply terminal capable of supplying a second power supply voltage, an input voltage selection circuit coupled to the first supply terminal and the second supply terminal, a first power supply switch, and a second power supply switch, the operating method comprising the steps of:

causing the input voltage selection circuit to have a power-on reset circuit, an input voltage detection circuit and a control circuit;

generating a power on reset signal from the power-on reset circuit in response to the supply of the first power supply voltage to the first supply terminal and the supply of the second power supply voltage to the second supply terminal;

generating a first voltage detection output signal from the input voltage detection circuit in response to the supply of the first power supply voltage to the first supply terminal and generating a second voltage detection output signal from the input voltage detection circuit in response to the supply of the second power supply voltage to the second supply terminal;

controlling the first power supply switch and the second power supply switch by the control circuit in response to the power on reset signal, the first voltage detection output signal and the second voltage detection output signal;

detecting the supply of the first power supply voltage to the first supply terminal and the supply of the second power supply voltage to the second supply terminal by the input voltage detection circuit at a timing of a change in the level of the power on reset signal responsive to the end of a power on reset operation of the power-on reset circuit;

controlling the first power supply switch and the second power supply switch to an on state and an off state respectively by the control circuit after the end of the power on reset operation in a first case where at the timing of the change in the level of the power on reset signal, the input voltage detection circuit detects the supply of the first power supply voltage to the first supply terminal but does not detect the supply of the second power supply voltage to the second supply terminal;

controlling the first power supply switch and the second power supply switch to the on state and the off state respectively after the end of the power on reset operation to thereby cause the first power supply switch controlled to the on state to supply the first power supply voltage supplied to the first supply terminal to a load;

controlling the first power supply switch and the second power supply switch to an off state and an on state respectively by the control circuit after the end of the power on reset operation in a second case where at the timing of the change in the level of the power on reset signal, the input voltage detection circuit detects the supply of the second power supply voltage to the second supply terminal but does not detect the supply of the first power supply voltage to the first supply terminal;

controlling the first power supply switch and the second power supply switch to the off state and the on state respectively after the end of the power on reset operation to thereby cause the second power supply switch controlled to the on state to supply the second power supply voltage supplied to the second supply terminal to the load;

controlling one of the first power supply switch and the second power supply switch and the other thereof to an on state and an off state respectively by the control circuit after the end of the power on reset operation in a third case where at the timing of the change in the level of the power on reset signal, the input voltage detection circuit detects the supply of the first power supply voltage to the first supply terminal and the supply of the second power supply voltage to the second supply terminal;

in the third case, controlling the one of the first power supply switch and the second power supply switch and the other thereof to the on state and the off state respectively in accordance with the order of precedence set to the control circuit in advance; and causing the one thereof controlled to the on state to supply the first power supply voltage or the second power supply voltage supplied to the first supply terminal or the second supply terminal to the load.

12. The operating method according to claim 11, including the steps of:

causing the semiconductor integrated circuit to further have a first external output terminal and a second external output terminal which supply the first power supply voltage or the second power supply voltage to a first external load and a second external load taken as the load respectively, causing the semiconductor integrated circuit to furthermore have an output P channel MOS transistor coupled between the first external output terminal and the second external output terminal, controlling the output P channel MOS transistor to an on state by the control circuit when either of the first power supply switch and the second power supply switch is controlled to an on state after the end of the power on reset operation, and controlling the output P channel MOS transistor to the on state to thereby enable the first power supply voltage or the second power supply voltage to be supplied to the second external load through the output P channel MOS transistor and the second external output terminal.

13. The operating method according to claim 12, including the steps of:

enabling the first external output terminal to supply the first power supply voltage or the second power supply voltage to the first external load corresponding to another semiconductor integrated circuit taken as an active device, and enabling the output P channel MOS transistor and the second external output terminal to supply the first power supply voltage or the second power supply voltage to the second external load taken as a battery.

14. The operating method according to claim 13, including the steps of:

causing the input voltage selection circuit to further have an input voltage selection switch and a gate drive circuit, causing the input voltage selection switch to have a first input P channel MOS transistor having a source coupled to the first supply terminal, and a second input P channel MOS transistor having a source coupled to the second supply terminal, controlling both of the first and second input P channel MOS transistors of the input voltage selection switch to an on state by the gate drive circuit during a power on reset period of the power-on reset circuit, and generating an operating voltage supplied to the power-on reset circuit from a drain of the first input P channel MOS transistor or a drain of the second input P channel MOS transistor during the power on reset period.

15. The operating method according to claim 14, including the steps of:

controlling the first and second input P channel MOS transistors of the input voltage selection switch to an on state and an off state respectively by the gate drive circuit in the first case, controlling the first and second input P channel MOS transistors of the input voltage selection switch to an on state and an off state respectively by the gate drive circuit in the second case, and controlling one of the first and second input P channel MOS transistors of the input voltage selection switch and the other thereof to an on state and an off state respectively by the gate drive circuit in accordance with the order of precedence set to the control circuit in advance in the third case.

16. The operating method according to claim 15, including the steps of:

causing the input voltage selection circuit to further have a voltage comparison/selection circuit having a first input terminal, a second input terminal and an output terminal, coupling the first input terminal of the voltage comparison/selection circuit to the drain of the first input P channel MOS transistor of the input voltage selection switch, coupling the second input terminal of the voltage comparison/selection circuit to the drain of the second input P channel MOS transistor of the input voltage selection switch, generating the operating voltage supplied to the power-on reset circuit from the output terminal of the voltage comparison/selection circuit, and comparing a voltage of the first input terminal and a voltage of the second input terminal by the voltage comparison/selection circuit to select a high voltage and thereby outputting the high voltage as the operating voltage supplied from the output terminal to the power-on reset circuit.

17. The operating method according to claim 13, including the steps of:

generating, by the occurrence of the first case, a fourth case in which the input voltage detection circuit detects the supply of the second power supply voltage to the second supply terminal after the first and second power supply switches are respectively controlled to the on state and the off state after the end of the power on reset operation, causing the control circuit to control, in response to the occurrence of the fourth case, the one of the first power supply switch and the second power supply switch and the other thereof to the on state and the off state respectively in accordance with the order of precedence set to the control circuit in advance, as with the third case, generating, by the occurrence of the second case, a fifth case in which the input voltage detection circuit detects the supply of the first power supply voltage to the first supply terminal after the first and second power supply switches are respectively controlled to the off state and the on state after the end of the power on reset operation, causing the control circuit to control, in response to the occurrence of the fifth case, the one of the first power supply switch and the second power supply switch and the other thereof to the on state and the off state respectively in accordance with the order of precedence set to the control circuit in advance, as with the third case, generating, by the occurrence of the third case, a sixth case in which the input voltage detection circuit detects the supply of the second power supply voltage to the second supply terminal after the one of the first and second power supply switches and the other thereof are respectively controlled to the on state and the off state after the end of the power on reset operation, and causing the control circuit to control, in response to the occurrence of the sixth case, the one of the first power supply switch and the second power supply switch and the other thereof to the on state and the off state respectively in accordance with the order of precedence set to the control circuit in advance, as with the third case.

18. The operating method according to claim 13, including the steps of:

generating, by the occurrence of the first case, a fourth case in which the input voltage detection circuit detects the supply of the second power supply voltage to the second supply terminal after the first and second power supply switches are respectively controlled to the on state and the off state after the end of the power on reset operation, enabling the semiconductor integrated circuit to notify the occurrence of the fourth case to said another semiconductor integrated circuit taken as the first external load in response to the occurrence of the fourth case, controlling the first power supply switch and the second power supply switch by the control circuit in accordance with a first indication supplied from said another semiconductor integrated circuit to the semiconductor integrated circuit, in response to a first notice indicative of the occurrence of the fourth case, controlling the first power supply switch and the second power supply switch to an on state and an off state respectively by the control circuit or controlling the first power supply switch and the second power supply switch to an off state and an on state respectively by the control circuit, in accordance with the first indication, generating, by the occurrence of the second case, fifth case in which the input voltage detection circuit detects the supply of the first power supply voltage to the first supply terminal after the first and second power supply switches are respectively controlled to the off state and the on state after the end of the power on reset operation, enabling the semiconductor integrated circuit to notify the occurrence of the fifth case to said another semiconductor integrated circuit taken as the first external load in response to the occurrence of the fifth case, controlling the first power supply switch and the second power supply switch by the control circuit in accordance with a second indication supplied from said another semiconductor integrated circuit to the semiconductor integrated circuit in response to a second notice indicative of the occurrence of the fifth case, controlling the first power supply switch and the second power supply switch to an off state and an on state respectively by the control circuit or controlling the first power supply switch and the second power supply switch to an on state and an off state respectively by the control circuit, in accordance with the second indication, generating, by the occurrence of the third case, a sixth case in which the input voltage detection circuit detects the supply of the second power supply voltage to the second supply terminal after the one of the first and second power supply switches and the other thereof are respectively controlled to the on state and the off state after the end of the power on reset operation, enabling the semiconductor integrated circuit to notify the occurrence of the sixth case to said another semiconductor integrated circuit taken as the first external load in response to the occurrence of the sixth case, controlling the first power supply switch and the second power supply switch by the control circuit in accordance with a third indication supplied from said another semiconductor integrated circuit to the semiconductor integrated circuit in response to a third notice indicative of the occurrence of the sixth case, and controlling the first power supply switch and the second power supply switch to an on state and an off state respectively by the control circuit or controlling the first power supply switch and the second power supply switch to an off state and an on state respectively by the control circuit, in accordance with the third indication.

19. The operating method according to claim 13, including the steps of:

causing the semiconductor integrated circuit to further have a step-down DC-DC converter and a linear regulator coupled in parallel between the first supply terminal and the first power supply switch, causing the linear regulator to operate as a series regulator which quickly operates immediately after power-on based on the supply of the first power supply voltage to the first supply terminal, and causing the step-down DC-DC converter to operate as a switching regulator having power efficiency higher than the linear regulator.

20. The operating method according to claim 19, including the steps of:

configuring the first supply terminal so as to be capable of supplying a power supply voltage based on a wireless power delivery to the first supply terminal through a first Schottky diode and an AC-DC conversion power supply voltage of an AC power supply coupling interface thereto through a second Schottky diode, and configuring the second supply terminal so as to be capable of supplying a USB power supply voltage of a USB coupling interface to the second supply terminal.

* * * * *